United States Patent [19]
Shih et al.

[11] Patent Number: 5,796,358
[45] Date of Patent: Aug. 18, 1998

[54] METHODS AND STRUCTURE FOR COMBINED ANALOG AND DIGITAL AUTOMATIC GAIN CONTROL IN SAMPLED-DATA RECEIVERS

[75] Inventors: Shih-Ming Shih; James Wilson Rae, both of San Jose; Richard A. Contreras, Los Altos; Jenn-Gang Chern, Sunnyvale, all of Calif.

[73] Assignee: NEC Electronics, Inc., Santa Clara, Calif.

[21] Appl. No.: 693,587

[22] Filed: Aug. 1, 1996

[51] Int. Cl.$^6$ .................................................. H03M 1/00
[52] U.S. Cl. .................................................. 341/139
[58] Field of Search .................................. 341/139, 159, 341/155, 156, 161; 358/461

[56] References Cited

U.S. PATENT DOCUMENTS 5,282,060   1/1994   Kizu et al. ..................... 358/461
5,343,200   8/1994   Matsui ........................... 341/139

*Primary Examiner*—Brian K. Young
*Attorney, Agent, or Firm*—Skjerven, Morrill, MacPherson, Franklin, & Friel; Alan H. MacPherson

[57] ABSTRACT

Analog-to-digital (ADC) output bits are partitioned in a way that simplifies the gain error calculations. Simplification of the gain error calculations allows a reduction in the complexity of the circuits needed to implement automatic gain control (AGC).

18 Claims, 20 Drawing Sheets

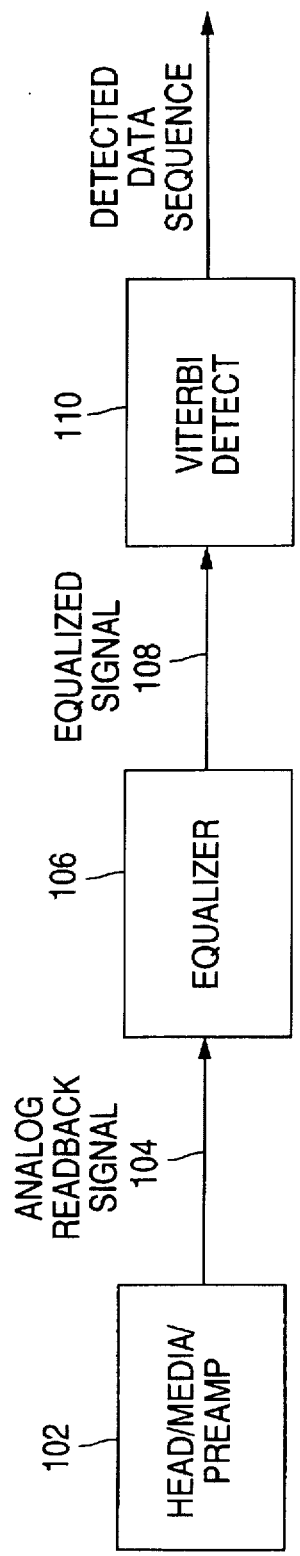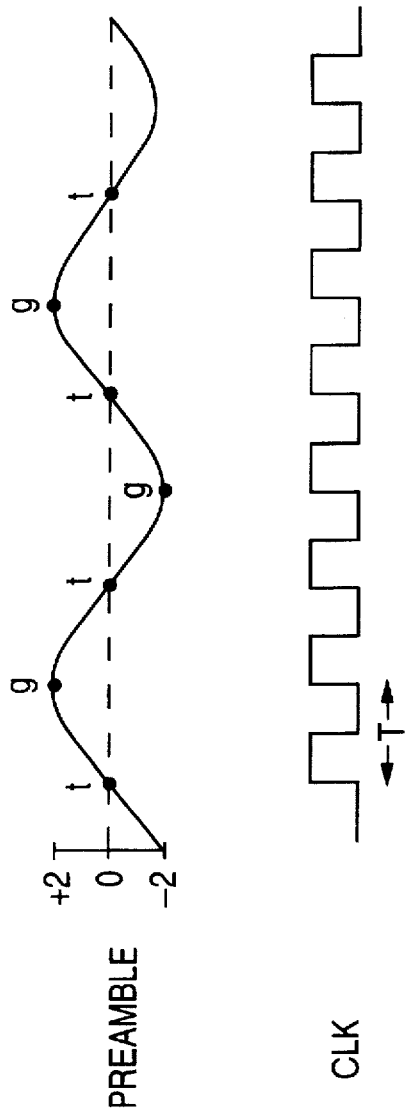

FIG. 8

| INPUT NORMALIZED | OUTPUT BINARY | XHAT | EHAT | INPUT NORMALIZED | OUTPUT BINARY | XHAT | EHAT |
|---|---|---|---|---|---|---|---|
| 2+7/16 | 010011 | 010 | 011 | 0-1/16 | 111111 | 000 | 111 |
| 2+5/16 | 010010 | 010 | 010 | 0-3/16 | 111110 | 000 | 110 |
| 2+3/16 | 010001 | 010 | 001 | 0-5/16 | 111101 | 000 | 101 |
| 2+1/16 | 010000 | 010 | 000 | 0-7/16 | 111100 | 000 | 100 |
| 2-1/16 | 001111 | 010 | 111 | -1+7/16 | 111011 | 111 | 011 |
| 2-3/16 | 001110 | 010 | 110 | -1+5/16 | 111010 | 111 | 010 |
| 2-5/16 | 001101 | 010 | 101 | -1+3/16 | 111001 | 111 | 001 |
| 2-7/16 | 001100 | 010 | 100 | -1+1/16 | 111000 | 111 | 000 |
| 1+7/16 | 001011 | 001 | 011 | -1-1/16 | 000111 | 111 | 111 |
| 1+5/16 | 001010 | 001 | 010 | -1-3/16 | 110110 | 111 | 110 |
| 1+3/16 | 001001 | 001 | 001 | -1-5/16 | 110101 | 111 | 101 |
| 1+1/16 | 001000 | 001 | 000 | -1-7/16 | 110100 | 111 | 100 |
| 1-1/16 | 000111 | 001 | 111 | -2+7/16 | 110011 | 110 | 011 |
| 1-3/16 | 000110 | 001 | 110 | -2+5/16 | 110010 | 110 | 010 |
| 1-5/16 | 000101 | 001 | 101 | -2+3/16 | 110001 | 110 | 001 |
| 1-7/16 | 000100 | 001 | 100 | -2+1/16 | 110000 | 110 | 000 |
| 0+7/16 | 000011 | 000 | 011 | -2-1/16 | 101111 | 110 | 111 |
| 0+5/16 | 000010 | 000 | 010 | -2-3/16 | 101110 | 110 | 110 |
| 0+3/16 | 000001 | 000 | 001 | -2-5/16 | 101101 | 110 | 101 |
| 0+1/16 | 000000 | 000 | 000 | -2-7/16 | 101100 | 110 | 100 |

TRACKING MODE GAIN DETECTOR

METHODS AND STRUCTURE FOR COMBINED ANALOG AND DIGITAL AUTOMATIC GAIN CONTROL IN SAMPLED-DATA RECEIVERS

CROSS-REFERENCE TO RELATED APPLICATIONS

This application relates to the co-pending application Ser. No. 08/690,950 (Attorney Reference No: M-3710 US), filed on the same day, entitled "METHOD AND APPARATUS FOR ADAPTIVELY PROCESSING THE READBACK SIGNAL IN A READ CHANNEL DEVICE FOR DIGITAL STORAGE", by Shih, Thapar and Contreras and to the co-pending application Ser. No. 08/695,327 (Attorney reference No: M-3711 US), filed on the same day, entitled "METHODS AND STRUCTURE FOR SAMPLED-DATA TIMING RECOVERY WITH REDUCED COMPLEXITY AND LATENCY", by Shih, Pan and Chern, all owned by the assignee of this application and incoporated herein by reference.

FIELD OF INVENTION

This invention relates to methods and structure for recovering the sampling clock and controlling the gain of a sampled-data receiver from a signal. More specifically, this invention relates to methods and structure for partitioning output bits from an analog-to-digital converter (ADC) in a way that simplifies the phase error and the gain error calculations so as to reduce the complexity of the circuits needed to implement both the phase-locked-loop (PLL) that is used to recover the sampling clock and the automatic gain control (AGC) function.

DESCRIPTION OF RELATED ART

Digital magnetic and optical storage applications involve the recording of digital sequences onto the media and the retrieval of such sequences from an analog signal, sensed by a readback head and corrupted by noise, interference, and distortion. The fundamental design goal is to achieve the highest recording density per unit area while maintaining an acceptable probability of error between the recorded and the retrieved sequences. In order to achieve the design goal, read/write channels use a combination of coding and equalization approaches. Each of these functions are reviewed below.

Run-Length Limited (RLL) Codes

Digital magnetic and optical storage devices use RLL codes to improve signal detectability or to insure frequent updates to the timing and gain loops, or both. The RLL codes are generally characterized by two parameters, d and k, which control, respectively, the minimum and the maximum number of symbol intervals between successive transitions in the binary input signal. For a given value of d, the RLL code insures that there are at least (d+1), and at most (k+1), symbol intervals between successive transitions. Commonly used codes in magnetic and optical storage products include codes with (d,k) constraints of (1,7) and (2,7). These codes are typically used with Peak Detection methods. Peak detection methods are asynchronous and involve the detection of single pulses. The k constraint insures that a non-zero channel output is produced with some minimum frequency to maintain robust operation of timing and gain loops. The d constraint helps signal detectability with peak detection. With the growing interest in Partial Response Maximum Likelihood (PRML) techniques, d=0 codes are gaining in popularity because of their inherently higher code rates.

Partial Response Signaling

One of the fundamental effects that limits the recording density in magnetic and optical recording systems is intersymbol interference (ISI). This effect is due to the bandlimited nature of the head/media combination and results in the overlap of responses due to sequentially recorded transitions on the media. That is, at a given instant in time, the output signal from the medium is composed of not only the response due to the input symbol at that instant, but also the responses from some previously recorded symbols. The amount and the span of this overlap increases as the linear recording density is increased, giving rise to overlap patterns among symbols that are generally very complex and hard to decipher with a simple device.

In order to reduce the complexity required to decipher the ISI effect, the readback signal is first equalized to a prescribed Partial Response (PR) signal. PR signals have the feature that allows for controlled overlap (or interference) of responses in the output signal due to successive input symbols. The a priori knowledge of the controlled ISI after the equalizer results in a significant reduction in the complexity of the required detector relative to the detector required for the unequalized signal.

As shown in FIG. 1, readback signal 104 from head/media/preamp 102 is sent to equalizer 106. Equalizer 106, also known as the PRML receiver, equalizes readback signal 104 to create equalized signal 108 which is a suitable PR signal.

One commonly-used PR target signal in data communications and in digital magnetic recording systems is characterized by the transfer polynomial $P(D)=1-D^2$, where D represents the transform of the unit symbol delay operation. This PR signal is commonly referred to as "Class IV PR" or modified duobinary signaling. The noise-free output response at a suitably prescribed sampling instant for Class IV PR is given by $y(nT)=a(nT)-a[(n-2)T]$, $n=2, 3 \ldots$, where $a(nT)$ is the input symbol at time instant nT, usually picked from a binary alphabet, $\{0,1\}$ or $\{1,-1\}$. That is, the output sample at time instant nT involves the overlap of two input symbols, $a(nT)$ and $a[(n-2)T]$.

Equalized signal 108 is then detected using a sequence detector such as Viterbi Detector 110, which is based on the Viterbi Algorithm. This combination of Class IV partial response with Viterbi detection is commonly referred to in the magnetic recording community by the acronym PRML for "Partial Response Maximum-Likelihood".

The choice of the PR target signal is not unique, but dictated by the operating linear density. Many well-known PR targets exist for the magnetic recording application. These targets are now commonly referred to as the "Extended Class IV" family of PR signals. The Extended Class IV family of PR signals is defined by the polynomials $P(D)=(1-D)(1+D)^n$, where n is a suitably chosen non-negative integer. Note that n=1 yields the standard Class IV PR signal; n=2 is commonly referred to as EPR4; and n=3 is referred to as $E^2PR4$, and so on.

Phase Error Calculation

The correct operation of any PRML system depends on sampling the readback signal synchronously. Even small time shifts from the correct sampling instant act to distort the sample values. To maintain proper timing of the read data, a timing recovery circuit or phase locked loop (PLL) as shown in FIG. 2 is used to adjust the phase of voltage controlled oscillator (VCO) 220 based on the phase error determined by digital phase error detector 210. Digital phase error detector 210 receives input from analog to digital converter (ADC) 230. During acquisition, the phase error is zero when the rising edge of the clock signal is aligned with the rising edge of the input signal. When the phase of the input signal and the phase of the oscillator diverge (due to, for example, noise and/or variation of disk rotation speed), the phase error becomes non-zero. A non-zero phase error causes digital phase error detector 210 to send a signal to charge pump 215 which outputs a current proportional to the phase error. The current from charge pump 215 is converted to a voltage by loop filter 235. The voltage shifts the frequency of VCO 220 to match phase with the input signal.

Timing recovery methods for synchronous data receivers have been investigated by K. H. Mueller and M. Muller, "Timing recovery in digital synchronous data receivers," IEEE Trans. Commun., vol. COM-24, pp. 516–530, May 1976 which is incorporated herein by reference. Specifically, for PRML it has been proposed by F. Dolivo, W. Schott, and G. Ungerboeck, "Fast timing recovery for partial response signaling systems," Int. Conf. Commun. '89, ICC'89, Boston, Mass., June 1989 (incorporated herein by reference) to update the timing-phase at time instant nT using the timing gradient:

$$\phi_{n\ error} = -y_n * \hat{x}_{n-1} + y_{n-1} * \hat{x}_n \quad (1)$$

where $y_n$ is the sampled value and $\hat{x}_n$ is the ideal sample value that is closest to $y_n$. In a PRML channel, $\hat{x}_n$ is restricted to take the values +1, 0, or −1. Once the phase error is obtained, usually a second order PLL is used to recover the sampling clock. The PLL operation is divided into two stages, acquisition and tracking. During acquisition, a sine wave with frequency equal to one quarter of the sampling frequency (i.e. having a period of 4T where T is the sampling interval) is used to provide the frequency and phase references for the PLL. The sine wave is written onto the disk, usually at the start of each track and is known as the preamble. Following the preamble on the disk is the user data which is sampled in tracking mode. The two stages are illustrated in FIG. 3. Preamble 310 is read during the acquisition and data 320 is read during the tracking mode. Since the sampling clock should be at the ideal sampling frequency and phase after acquisition, the PLL bandwidth is lowered in the tracking mode to reduce timing jitter.

Implementations of EPRML channels have been investigated previously by R. Wood, "Turbo-PRML: A Compromise EPRML Detector," IEEE Trans. on Magnetics, vol. 29, no. 6, pp. 4018–4020, November 1993 and E. Eleftheriou and W. Hirt, "Improving Performance of PRML/EPRML through Noise Prediction," INTERMAG 96, Seattle, Wash., April 1996 which are incorporated herein by reference. These implementations invariably include an additional signal processing block after the conventional PR4 Viterbi detector to achieve the improved performance of EPRML without modifying the timing loop.

Gain Recovery

Correct gain control is also important since all decisions about data, samples and timing are based on the assumption that the system amplification is correct. In the PRML case this means that the +1 and −1 levels or in the EPRML case that the +2, +1, −1 and −2 levels should be known a priori. Hence, it is common practice in storage read channel technology to include a variable gain amplifier (VGA) to maintain a constant sampled signal amplitude. This operation of controlling the VGA gain to maintain a constant signal amplitude is known as automatic gain control (AGC). A typical AGC block diagram is shown in FIG. 4a. For automatic gain control during analog acquisition, variable gain amplifier (VGA) 420 sends the amplified sine wave to filter/equalizer 430 to create an equalized signal. Feedback loop 445 serves to control VGA 420 during analog acquisition. For automatic gain control during digital tracking, the equalized signal is digitized in analog-to-digital converter (ADC) 440. The digitized signal is sent to digital gain error detector 410. An appropriate signal is sent from digital gain error detector 410 to VGA 420 to update the gain of the signal.

FIG. 4b shows a three stage AGC function which utilizes both analog acquisition mode 460 and digital acquisition mode 470 with preamble 455. Digital tracking mode 480 is engaged prior to the end of preamble 455 to ensure that data is properly tracked upon receipt. AGC functions for PRML channels have been proposed that update the VGA gain by using the gradient:

$$\hat{e}_n = y_n - \hat{x}_n \quad (3)$$

$$\text{gain error}_n = \hat{e}_n * \hat{x}_n \quad (4)$$

where $y_n$ is the sampled value, $\hat{x}_n$ is the ideal sample value that is closest to $y_n$ and $\hat{e}_n$ is the decision error. Note that $\hat{x}_n$ is either +1, −1 or 0 for PR4. Once the gain error is obtained, a first order AGC loop typically is used to adjust the VGA gain. The AGC operation is divided into two stages, acquisition and tracking. During acquisition, a sine wave with a frequency equal to one quarter of the sampling frequency is used to provide the signal amplitude reference for the AGC to control. Both continuous-time and discrete-time methods are used to implement the acquisition mode for gain. See R. Cideciyan, F. Dolivo, R. Hermann, W. Hirt and W. Schott, "A PRML System for Digital Magnetic Recording," IEEE Journal on Selected Areas in Communications, Vol. 10, No. 1, pp. 38–56, January 1992 and R. Yamasaki, T-W. Pan, M. Palmer and D. Browning, "A 72 Mb/s PRML Disk-Drive Channel Chip with an Analog Sampled-Data Signal Processor," Proc. of IEEE ISSCC, San Francisco, 1994, pp. 278–279 which are incorporated herein by reference for a more complete discussion. In the continuous-time implementation, a peak detector is used to derive the amplitude error. After the acquisition, it is assumed that the VGA gain has acquired the ideal value and the AGC bandwidth is lowered in the tracking mode to reduce noise sensitivity.

Different implementations of EPRML channels have also been investigated previously. These invariably include an additional signal processing block after the conventional PR4 Viterbi detector to achieve the improved performance of EPRML without modifying the AGC loop.

EPRML relaxes the need for significant equalization and the EPRML detector can generally tolerate poorer high frequency signal-to-noise ratio (SNR) from the recording channel. EPRML can therefore operate at higher linear densities than PRML. However, implementation of EPRML has been hindered by the added complexity of the circuitry that is required which leads to longer processing times and lower data throughput rates.

SUMMARY OF THE INVENTION

The invention relates to methods and structure for recovering the sampling clock and for controlling the gain of a sampled-data receiver. In one embodiment, the sampling clock is recovered from a signal which is digitized from a d=0 run-length constrained data channel equalized to the Extended Class IV (EPR4) partial response target. The EPRML channel is by nature a synchronous detection channel and thus requires sampling of the read signal in proper amplitude, frequency and phase.

Specifically, in accordance with one embodiment a clock recovery algorithm is employed for an EPRML channel. Samples which are equalized to EPR4 are used to derive the timing gradient without going through PR4 as an intermediate step. The circuit architecture embeds the implementation of the phase error calculations in the analog-to-digital converter (ADC) to simplify the overall circuit implementation. In one embodiment, the bit slices in the analog-to-digital converter (ADC) sample the data input signal, the data input signal being encoded into an ideal sample value closest to the data input signal and a decision error. In accordance with one embodiment of the invention, the sampled reference output signals of the comparators are used to directly drive a phase error digital-to-analog converter without additional signal processing for the acquisition mode. The phase error digital-to-analog converter provides a control signal to the timing circuit. Embodiments of this invention may be implemented in a number of technologies; for example, bipolar, CMOS or gallium arsenide technologies may be used in accordance with this invention.

Samples are equalized to EPR4 to derive the gain error by utilizing a gain control algorithm for an EPRML channel without going through PR4 as an intermediate step. The circuit architecture embeds the implementation of the gain error calculations in the ADC to simplify the overall circuit implementation. An intermediate stage is introduced between the analog continuous-time acquisition mode and the digital discrete-time tracking mode. The intermediate digital discrete-time acquisition mode compensates for potential mismatches between the voltage reference of the analog acquisition loop and the voltage reference of the ADC during the digital tracking loop.

Both the gain digital discrete-time acquisition mode and the gain digital discrete-time tracking mode use the input signal encoded into the ideal signal sample value and the decision error. The ideal signal sample value and the decision error in one embodiment are represented by three (3) bits each. Calculations for phase error and gain error performed in the circuit in one embodiment use the sign of the ideal signal sample value in place of the ideal sample signal value. The result of the phase error and the gain error is converted into a positive or negative current to drive the respective loop filters for the timing and gain circuits. The use of a current to control the timing and gain circuits is merely one embodiment and other control signals are possible.

The present invention allows simplified circuitry and therefore assists in making a single chip implementation of EPRML feasible. The circuitry of this invention is also faster than prior art circuitry.

This invention will be more fully understood in view of the drawings taken together with the following detailed description.

BRIEF DESCRIPTION OF THE DRAWINGS

FIG. 1 shows a typical PRML block diagram.

FIG. 5 shows the acquisition timing and gain sample points for EPRML.

FIG. 8 shows the relationships of comparator values (CMP), analog to digital converter (ADC) thresholds and thermometer code levels.

DETAILED DESCRIPTION

According to the principles of this invention, methods and structure for partitioning the ADC output bits in a way that reduces the complexity of the phase error and gain error calculations are provided. Consequently, the implementation of the phase-locked-loop (PLL) that is used to recover the sampling clock and the implementation of the automatic gain control (AGC) loop are less complex and more efficient than previous implementations. An improved phase error calculation and an improved gain error calculation are described for the EPR4 target. In accordance with one embodiment, a zero-phase restart is used to start the clock at a "0" crossing of the 4T sine wave preamble. The object of the timing loop during acquisition is to adjust the timing clock such that samples are taken at "0" crossings of the sine wave preamble.

The timing gradient used for EPRML is:

$$\hat{e}_n = y_n - \hat{x}_n \quad (5)$$

$$\phi_n = -\hat{e}_n * \text{sign}[\hat{x}_{n-1}] + \hat{e}_{n-1} * \text{sign}[\hat{x}_n] \quad (6)$$

where $y_n$ is the sampled value, $\hat{x}_n$ (which in EPRML can take one of 5 possible values: +2, +1, 0, −1, −2) is the ideal sample value that is closest to $y_n$, $\hat{e}_n$ is the decision error and the $\text{sign}[\hat{x}_n]$ function is defined by $$\text{sign}[\hat{x}] = +1 \text{ if } \hat{x} = +2, +1$$

$$\text{sign}[\hat{x}] = 0 \text{ if } \hat{x} = 0$$

$$\text{sign}[\hat{x}] = -1 \text{ if } \hat{x} = -2, -1 \quad (7)$$

The sign function may also be defined as being +1 for x>0, 0 for x=0, and −1 for x<0 if x values other than +2, +1, 0, −1, −2 are contemplated.

The timing gradient of Eq. (6) is obtained by substituting $y_n = \hat{x}_n + \hat{e}_n$ into Eq. (1):

$$\phi_{n\,error} = -(\hat{x}_n + \hat{e}_n) * \hat{x}_{n-1} + (\hat{x}_{n-1} + \hat{e}_{n-1}) * \hat{x}_n$$

$$= -\hat{e}_n * \hat{x}_{n-1} + \hat{e}_{n-1} * \hat{x}_n$$

and simplifying further by replacing $\hat{x}$ (ideal sample value closest to the input signal) by $\text{sign}[\hat{x}]$. Since the timing gradient equation is not implemented in a "one shot" but rather in a successive approximation loop, the substitution of $\text{sign}[\hat{x}_n]$ for $\hat{x}_n$ does not appreciably affect the performance of the PLL and typically adds no more than 10% additional timing phase jitter. The substitution and simplification reduce the magnitude of the terms in the equation for the phase error, allowing a smaller bit resolution to be used to represent the terms thereby allowing the required chip space to be reduced and the speed of the calculation to be increased.

Figure 2:
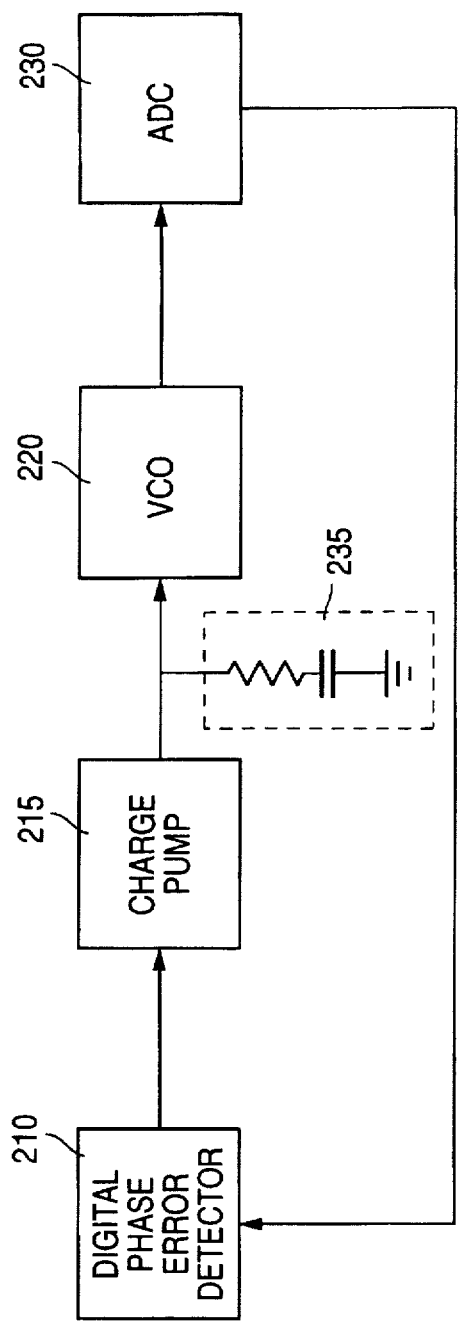
FIG. 2 shows a typical phase lock loop block diagram.
Figure 3:
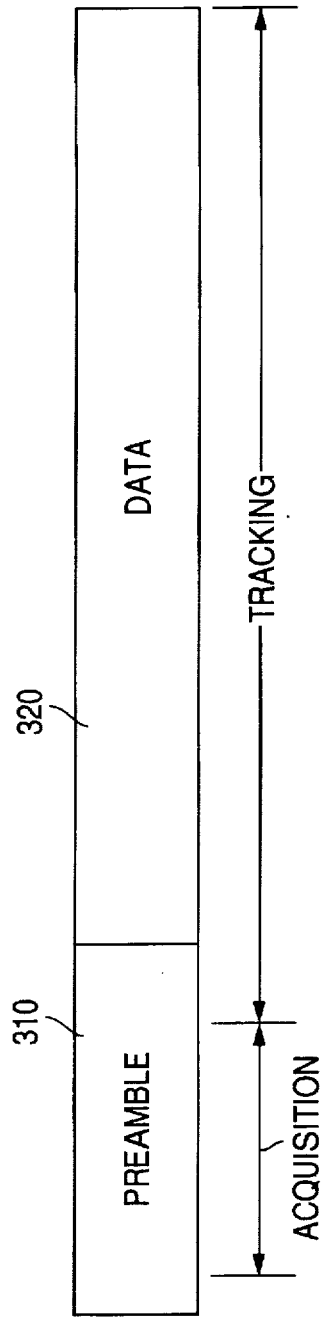
FIG. 3 shows the operation of a phase lock loop system.
Figure 4A:
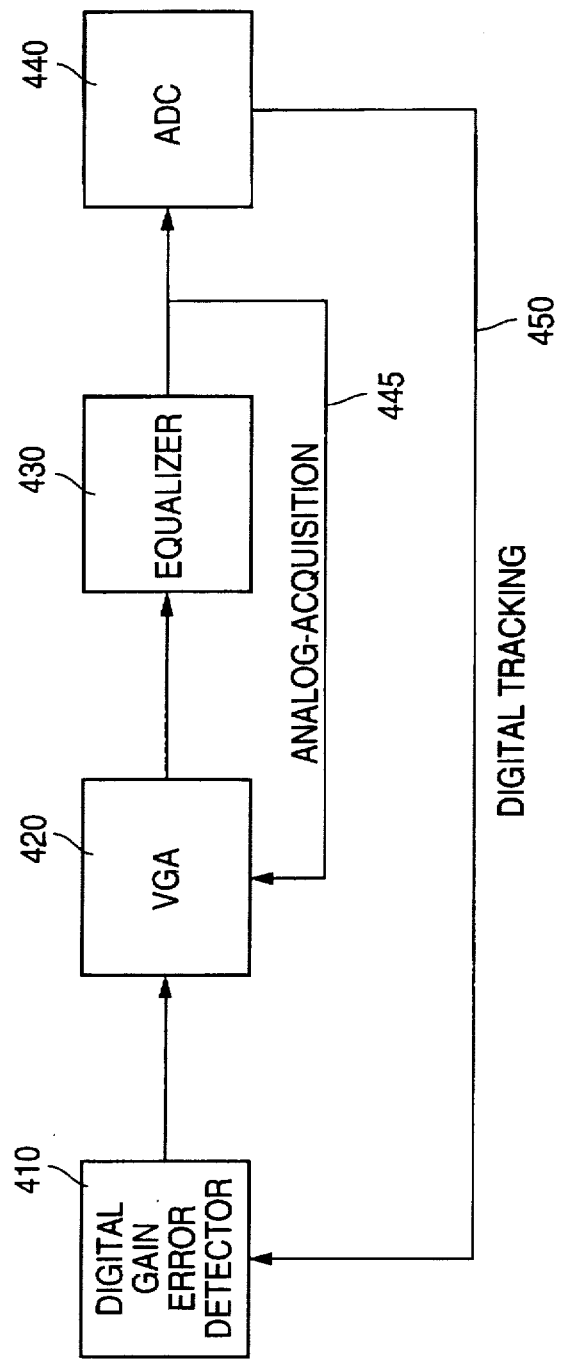
FIG. 4a shows a typical automatic gain control block diagram.
Figure 4B:
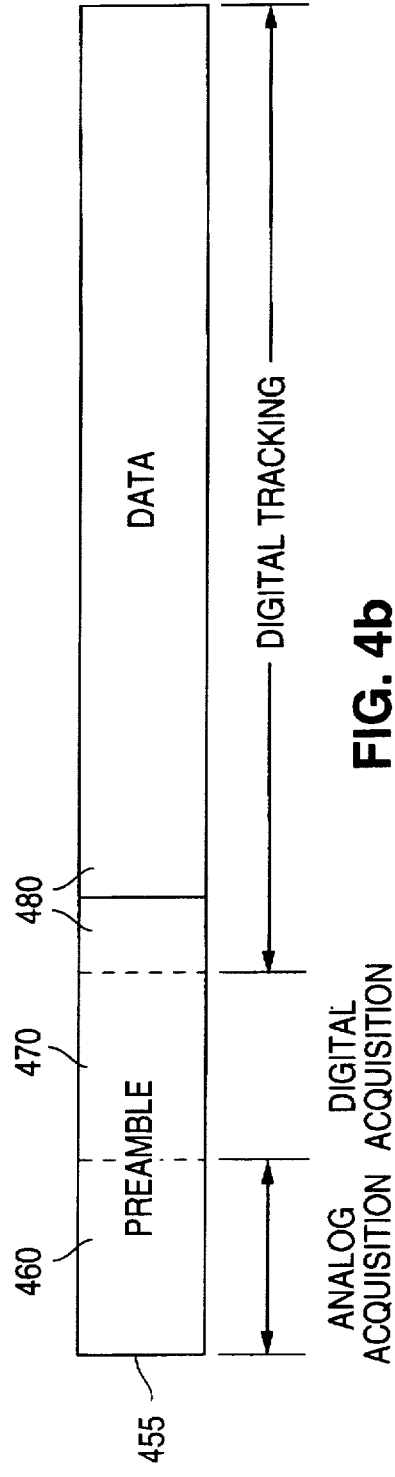
FIG. 4b shows a three stage AGC function.

A three stage AGC operation as shown in FIG. 4b is used for compensating for circuit mismatches between the analog continuous-time acquisition mode and the digital discrete-time tracking mode. To ensure that data is properly tracked upon receipt, digital tracking begins during the preamble.

The acquisition PLL timing and acquisition AGC modes are effectively decoupled from each other once the gain and phase are close to their ideal values since the acquisition PLL loop is dependent on the "0" crossings of the sine wave preamble while the acquisition AGC loop is dependent on the peaks of the sine wave preamble. As shown in FIG. 5, the PLL circuit uses the "0" crossings t to provide timing information while the +− "2" peaks g are used by the AGC loop for gain information, thereby allowing time 2T for timing and gain signal processing during acquisition. During tracking, orthogonality is maintained due to the locking of the PLL and every sample value is used in both the tracking AGC and PLL circuits. Therefore, the phase and gain recovery loops provide simultaneous tracking of correct system gain and clock.

Figure 6:
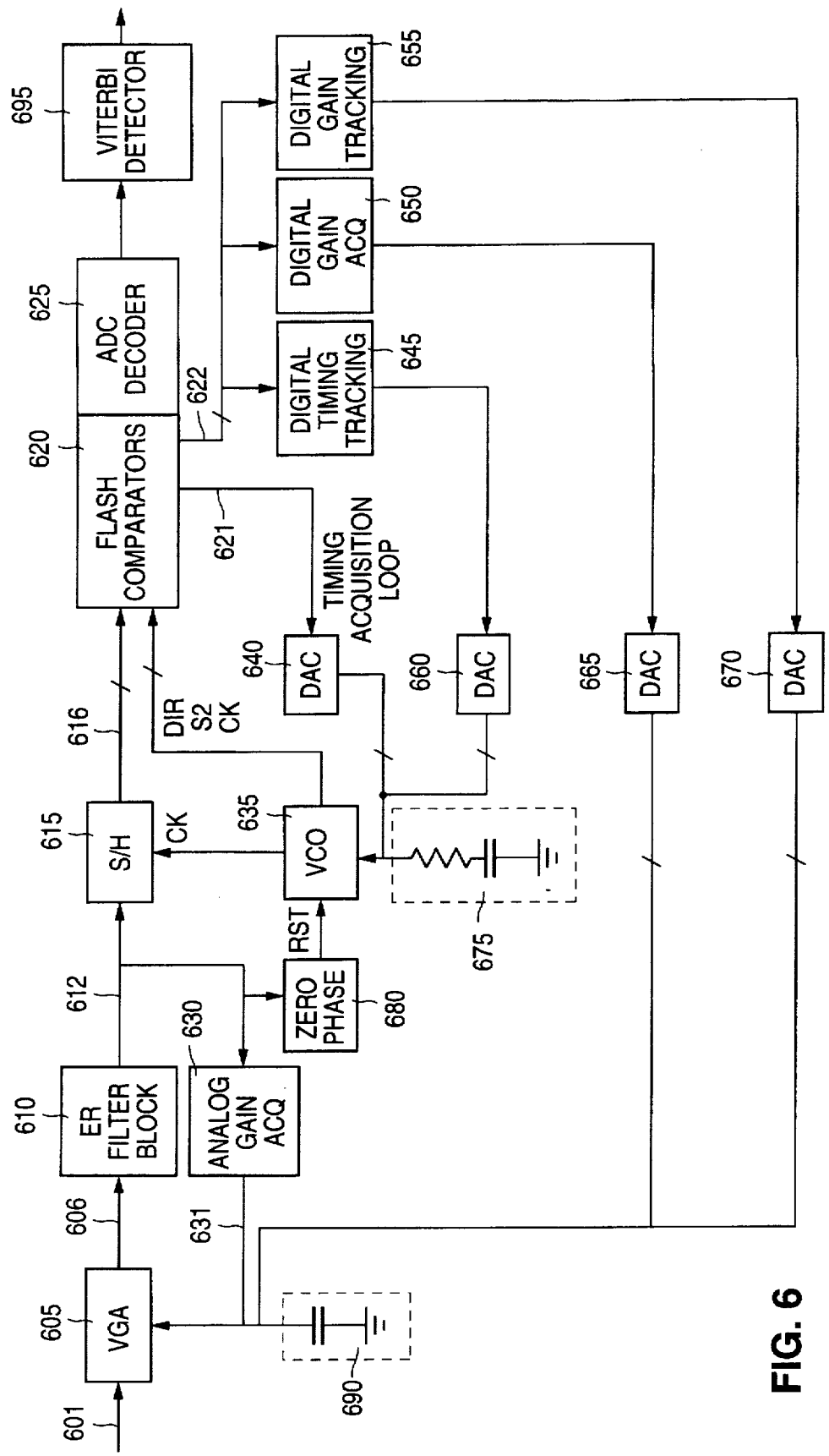
FIG. 6 shows a combined phase lock loop and automatic gain control block diagram in accordance with an embodiment of this invention.

FIG. 6 is a block diagram of one embodiment of the combined ADC/timing and ADC/gain architecture. An analog read signal on lead 601 is applied to a variable gain amplifier (VGA) 605. VGA output signal on lead 606 is sent to ER (Equalized Receiver) filter block 610. Details on the optimal setting for ER filter block 610 are provided in the patent application "Method and Apparatus for Adaptively Processing the Readback Signal in a Read Channel Device for Digital Storage," incorporated herein by reference, filed on the same day as this application and assigned to the same assignee. Analog gain acquisition block 630 receives equalized signal on lead 612 and provides gain control current on lead 631 to gain loop filter 690. Gain loop filter 690 provides a control voltage to VGA 605 to adjust the gain of the sine wave preamble received by VGA 605. Sample and hold circuit (S/H) 615 samples equalized signal on lead 612 to provide stable signal on lead 616 for flash comparators 620.

Digital output signal on lead 621 from flash comparators 620 goes to acquisition loop DAC 640. Digital output signals on leads 622 from flash comparators 620 go to digital timing tracking circuit 645, digital gain acquisition circuit 650 and digital gain tracking circuit 655. ADC flash comparators 620 and acquisition loop digital-to-analog converter (DAC) 640 are shown in more detail in FIGS. 11a–11c for one embodiment. Digital timing tracking circuit 645 includes an encoder and is shown in more detail in FIG. 13 for one embodiment. Digital timing tracking circuit 645, digital gain acquisition circuit 650 and digital gain tracking circuit 655 control DAC 660, DAC 665 and DAC 670, respectively. DAC 640 and DAC 660 each provide $I_{up}$ or $I_{down}$ currents. The $I_{up}$ and $I_{down}$ currents are converted by adjustable external loop filter 675 into a voltage to drive voltage controlled oscillator (VCO) 635. The control voltage supplied to VCO 635 allows for frequency and phase adjustment of the clock signal (CK). Zero-phase restart 680 is used to start the clock at a "0" crossing of the sine wave preamble. Typically, loop filter values are chosen so that the filter bandwidth is, for example, 1% of the clock rate during acquisition with a reduction in bandwidth on the order of two to three for tracking mode. VCO 635 provides control signal DIR, control signal S2 and clock signal CK to the flash comparators 620. DAC 665 and DAC 670 provide current to adjust the gain of VGA 605 during acquisition and tracking, respectively.

Figure 7:
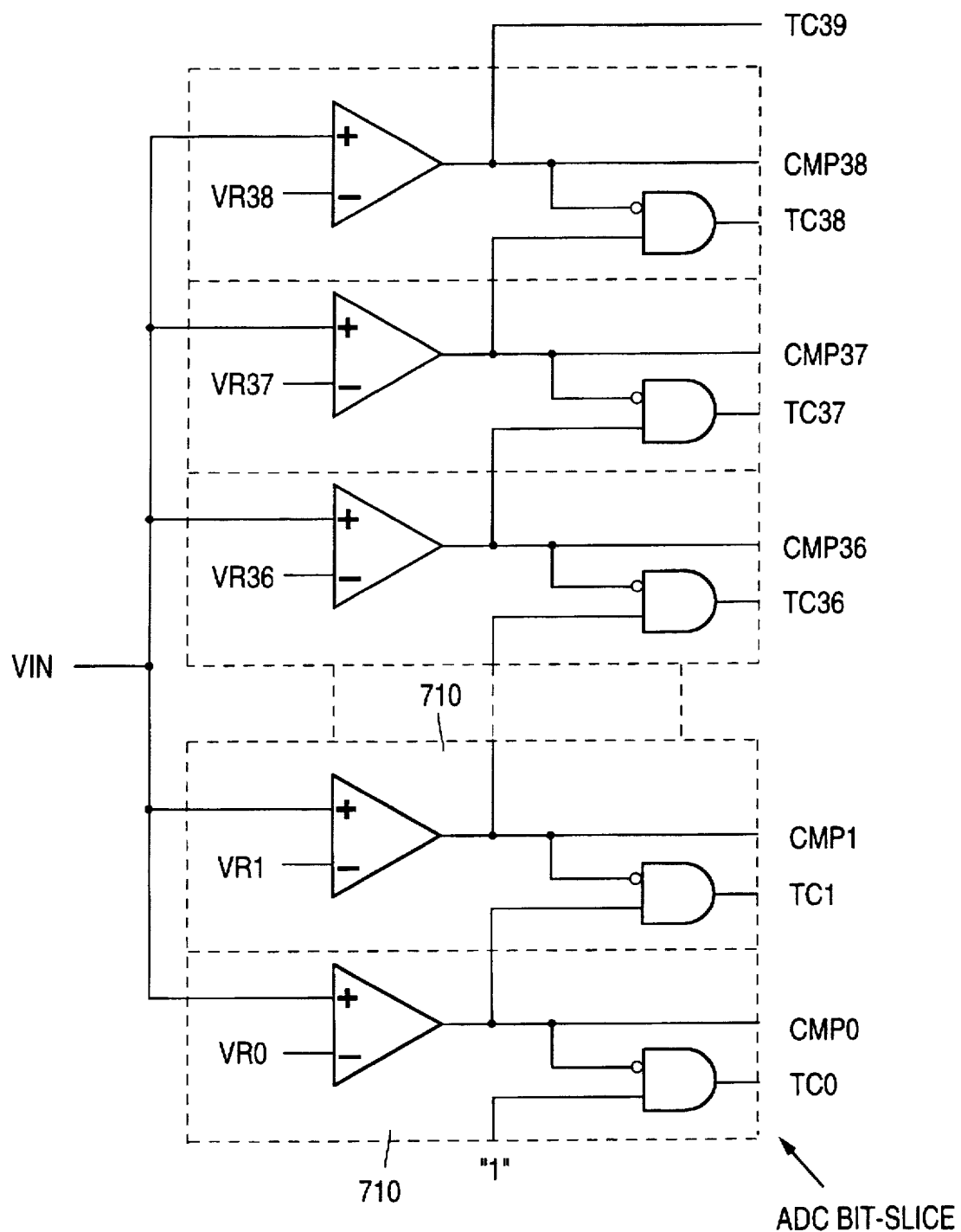
FIG. 7 shows a simplified flash analog to digital converter.

A simplified 40 level flash ADC embodiment is shown in FIG. 7. Each level consists of a bit-slice, which contains a comparator 710 and several latches (not shown in FIG. 7). Each slice has two input leads: on one lead is the input voltage VIN and on the other lead is a reference voltage $VR_K$, where K=0 to 38 (i.e. 39 reference voltages). The comparator output signal, $CMP_K$, outputs a first logic state if VIN>$VR_K$, or a second logic state if VIN≤$VR_K$. The embodiment of FIG. 7 uses logic high as the first logic state and logic low as the second logic state.

A flash ADC works as follows: suppose VIN satisfies $VR_{K+1}$>VIN≥$VR_K$, then the comparator outputs will be: $CMP_0$=$CMP_1$= . . . =$CMP_K$=1, and $CMP_{K+1}$=$CMP_{K+2}$= . . . =$CMP_{38}$=0. Since the CMP output signals are all 1's from $CMP_0$ to $CMP_K$, and all 0's from $CMP_{K+1}$ to $CMP_{38}$, resembling a thermometer, the CMP outputs are commonly referred to as thermometer codes. The thermometer code is decoded using the AND gates shown in FIG. 7 to produce a 40 bit thermometer level code, $TC_0$ to $TC_{39}$. Only one of the TC's is at logic 1 for a given VIN, and all others are 0, thereby identifying the voltage level at which the output signals from the comparators transition from a "1" to a "0". In the case $VR_{K+1}$>VIN>$VR_K$, only $TC_K$ becomes 1. The TC's are further encoded to form the final outputs of the ADC. Typically several clock cycles are required to form the final ADC outputs which go to Viterbi decoder 695.

Figure 8:
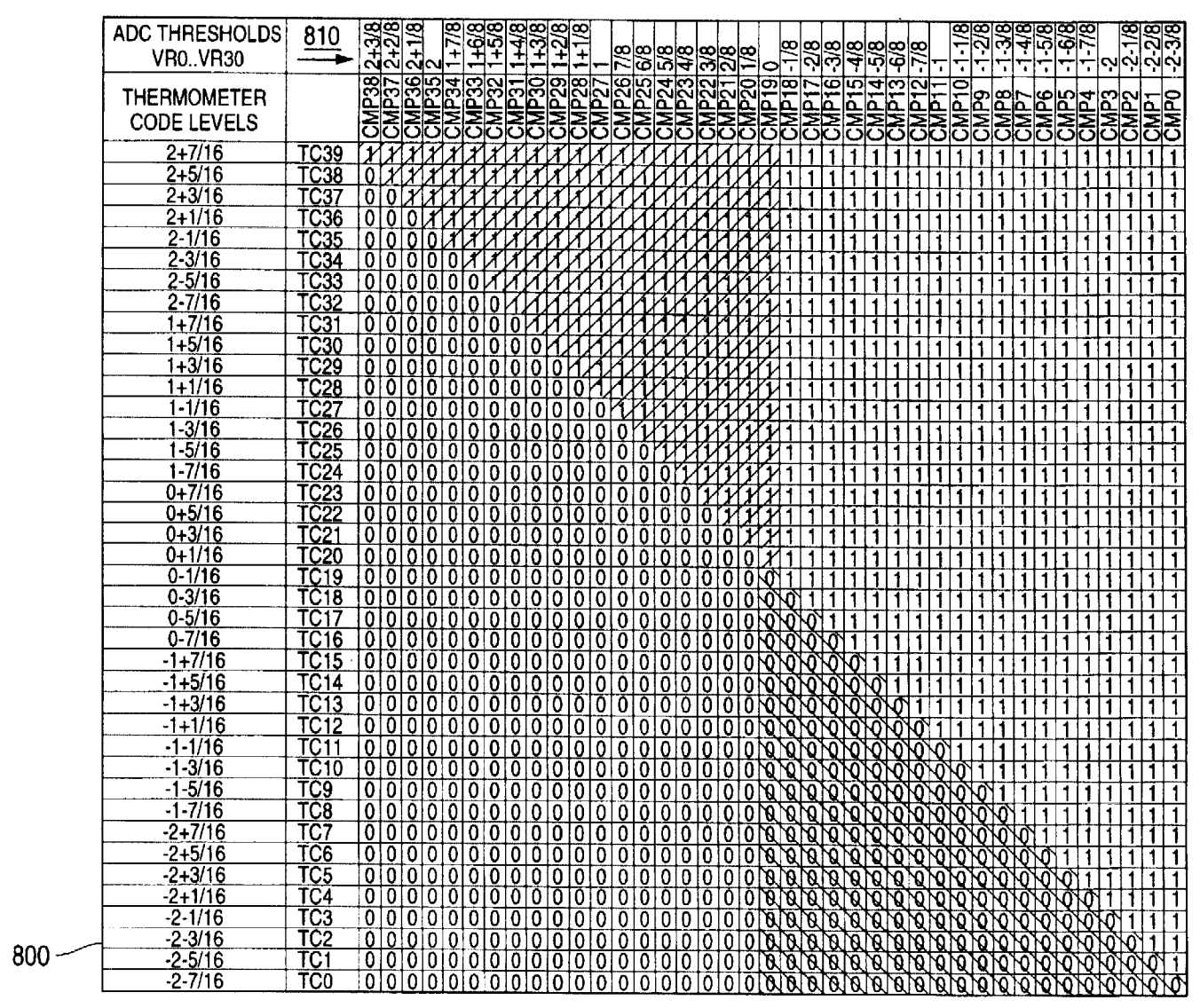

FIG. 8 summarizes the relationships of the thermometer codes, the CMP's and the TC's in accordance with an embodiment of this invention. Topmost row 810 in table 800 shows the ADC thresholds. Each CMP column represents the response of that CMP at different input signal levels. Each row to the right of the TC's represents the condition under which that TC will become "1". For example, $TC_0=1$ when the output signals from all CMP's are "0", and $TC_{39}=1$ when the output signals from all CMP's are "1". The leftmost column represents the normalized output signal levels of the TC's. For example, $TC_{19}=1$ corresponds to VIN=–⅟₁₆ and $TC_{20}=1$ corresponds to VIN=+⅟₁₆.

The phase error information for EPRML during acquisition is contained in the "0" crossings. A phase error results in a large voltage change near "0" crossings and a small voltage change near peaks. Outputs of flash comparators 620 are used directly to drive phase error DAC 640 for acquisition without additional signal processing through an encoder. This reduces the circuitry as well as minimizing the computational delay. Minimizing the computational delay during acquisition is especially important because in acquisition mode the PLL is operating at a substantially higher bandwidth than when the PLL is operating in tracking mode.

For EPR4 timing recovery, the preamble is a 4T sine wave where T is the sampling interval. When the sine wave is properly locked during acquisition mode, the ADC should only produce "0", "2" and "–2" samples. The "0" samples of the sine wave contain the timing error information and the "0" samples are used to drive the timing loop to correct clock phase of VCO 635. Since the "0" samples (with noise) should excite only the middle portion of the ADC, using only the response around $TC_{19}$ and $TC_{20}$ shown in FIG. 8 would not materially degrade the PLL. The deviation from zero, seen by the CMP's, forms two triangles (shaded area in FIG. 8). The upper triangle corresponds to the deviation of a positive "0", while the lower triangle corresponds to deviation of a negative "0". Therefore, the CMP output signals around the middle portion of the ADC are used as a "0" detector, with two output signals, $I_{up}$ and $I_{down}$, going to the phase detector in the acquisition mode. $I_{up}$ and $I_{down}$ provide a measure of large the phase error is and of what sign the phase error is at a signal sample point.

Phase Locked Loop

Figure 9:
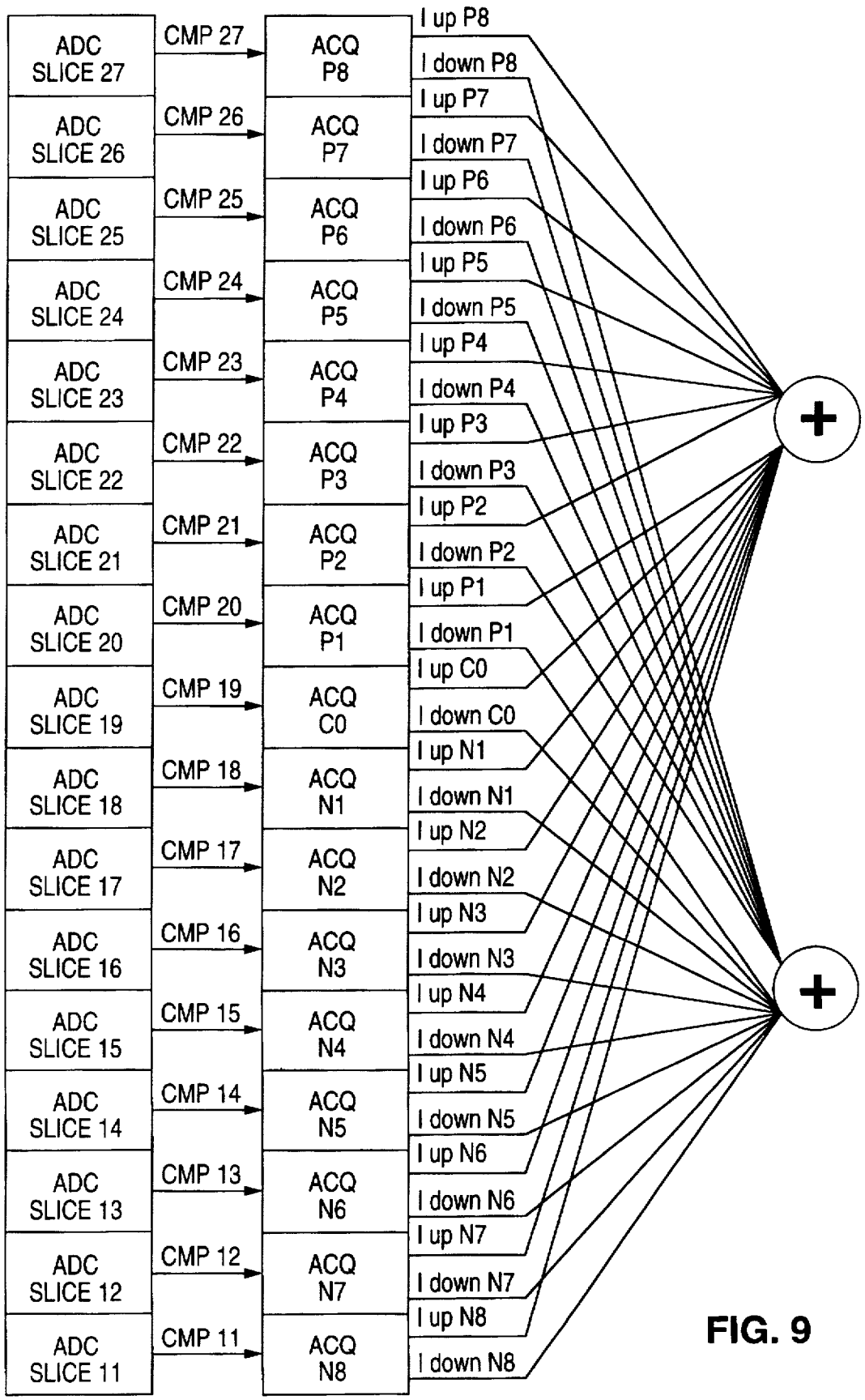
FIG. 9 shows the portion of the ADC used during acquisition in accordance with an embodiment of this invention.

FIG. 9 shows a block diagram of the timing acquisition function using the flash comparator output signals (CMP's), according to one embodiment of this invention. Only the slices around the ADC center portion are used, because these slices detect the "0" samples as explained above. Each of the ADC slices drives a Timing ACQ slice, each slice generating $I_{up}$, $I_{down}$ or no current at all. $I_{up}$ and $I_{down}$ provide a measure of the phase error between the VCO reference clock and the input signal. $I_{up}$ or $I_{down}$ in turn drive the PLL loop filter. Since the intermediate signals in flash comparators 620 are directly used to generate $I_{up}$ and $I_{down}$ in DAC 640, the associated processing delay is much less than that of conventional methods, where fully encoded output signals are used to drive the DAC during acquisition.

Figures 10A, 16:
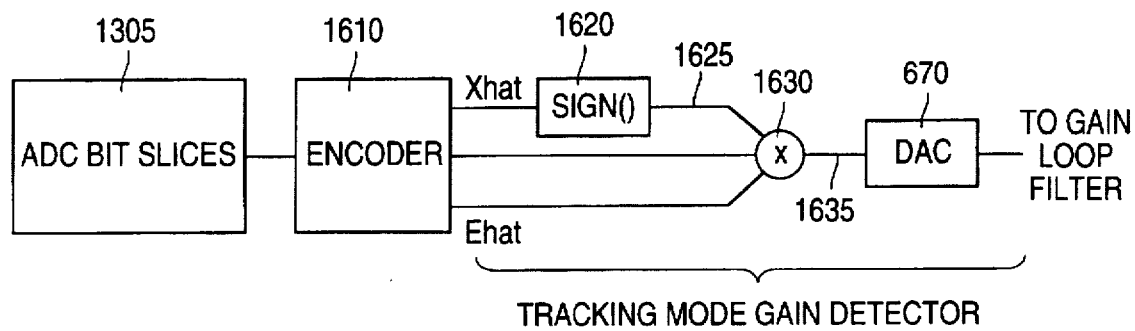
FIG. 10a shows the one-to-one mapping of the thermometer code levels to $(\hat{x}, \hat{e})$ format.
FIG. 16 shows a digital tracking mode gain detector block diagram in accordance with an embodiment of this invention.
Figure 10B:
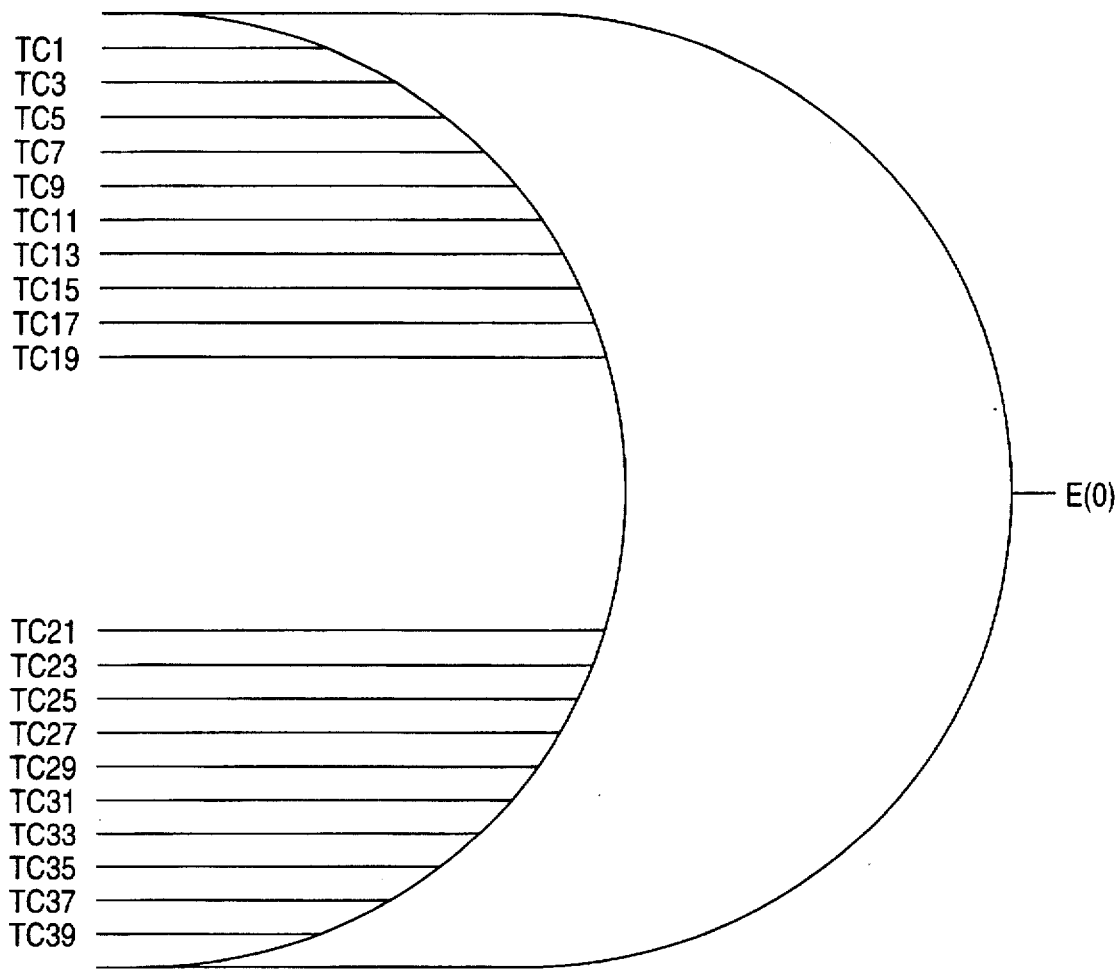
FIG. 10b shows an embodiment of the one-to one mapping of the thermometer code levels to provide the e(0) bit of ê using a wide OR gate.
Figure 10C:
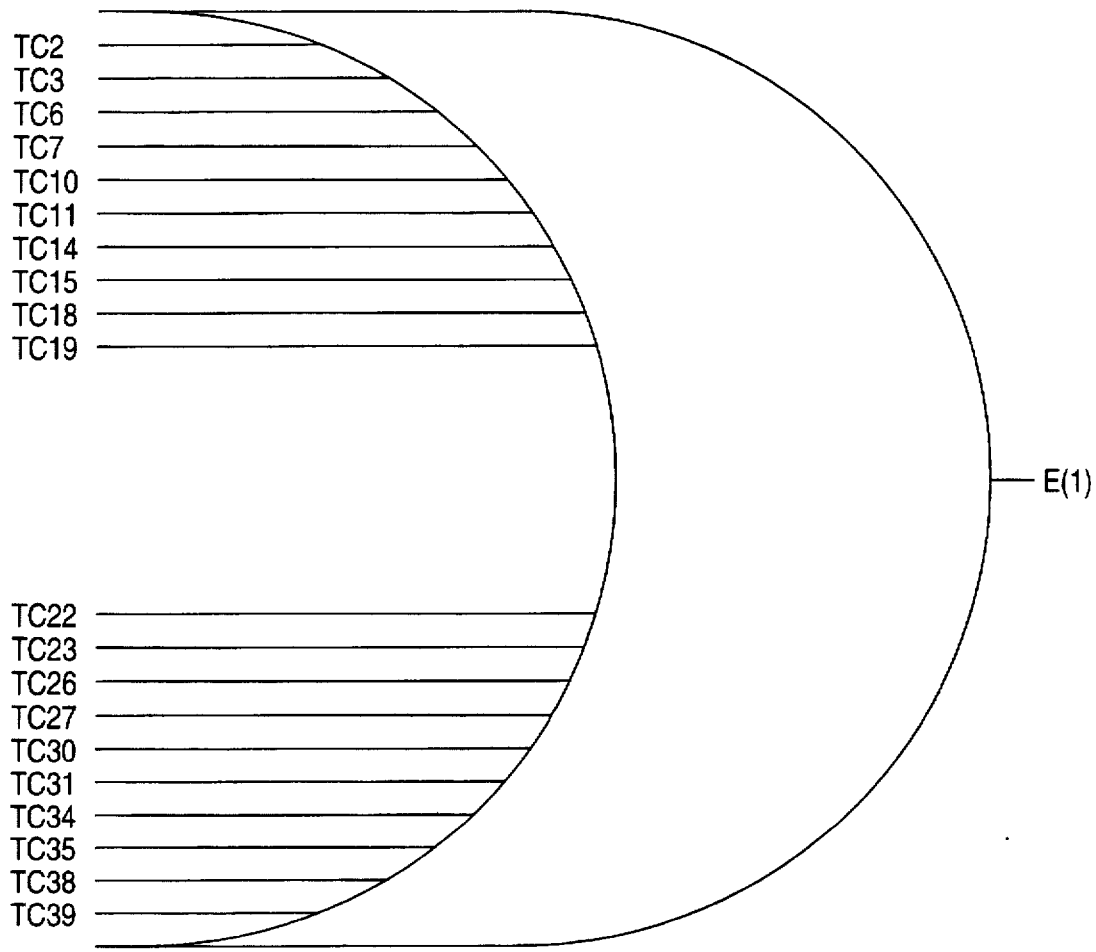
FIG. 10c shows an embodiment of the encoding of the thermometer code levels to provide the e(1) bit of ê using a wide OR gate.
Figure 10D:
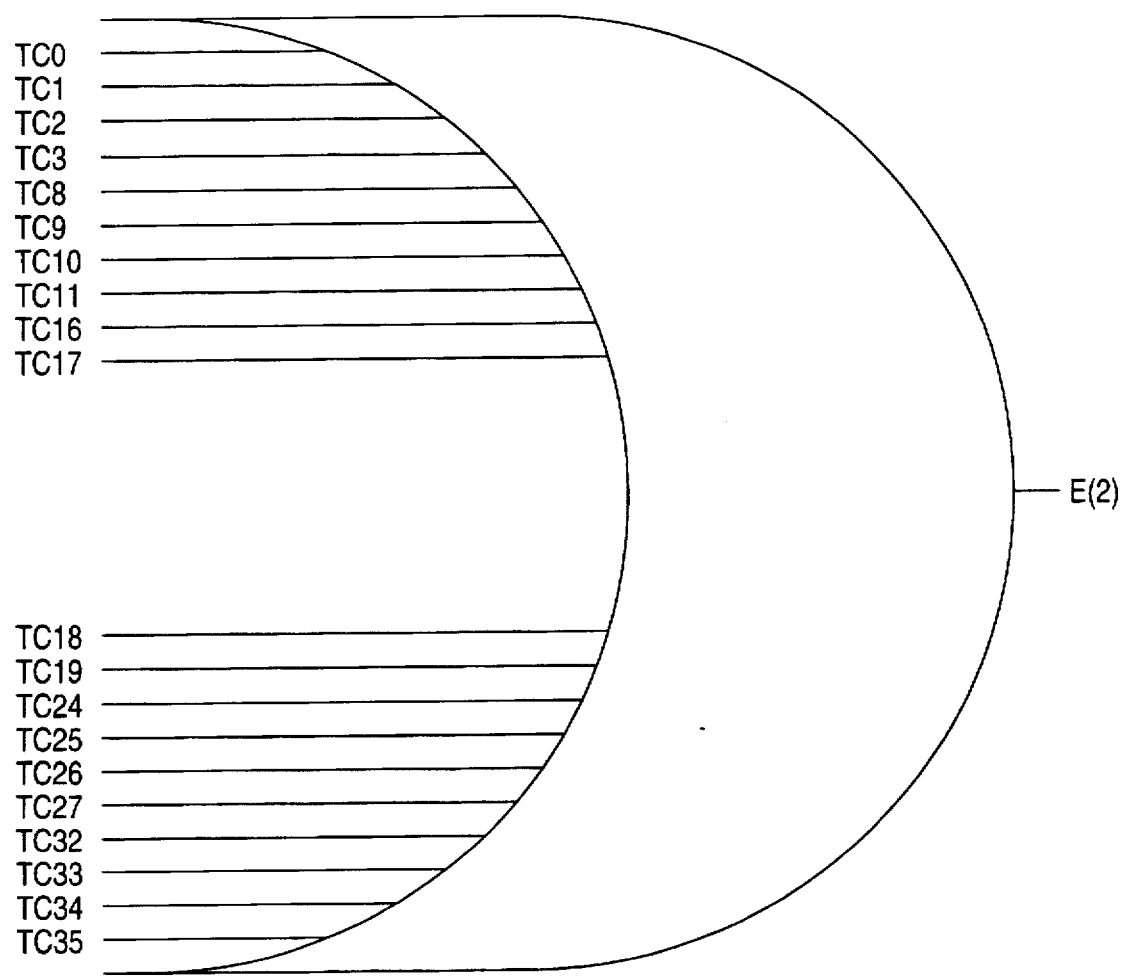
FIG. 10d shows an embodiment of the encoding of the thermometer code levels to provide the e(2) bit of ê using a wide OR gate.
Figure 10E:
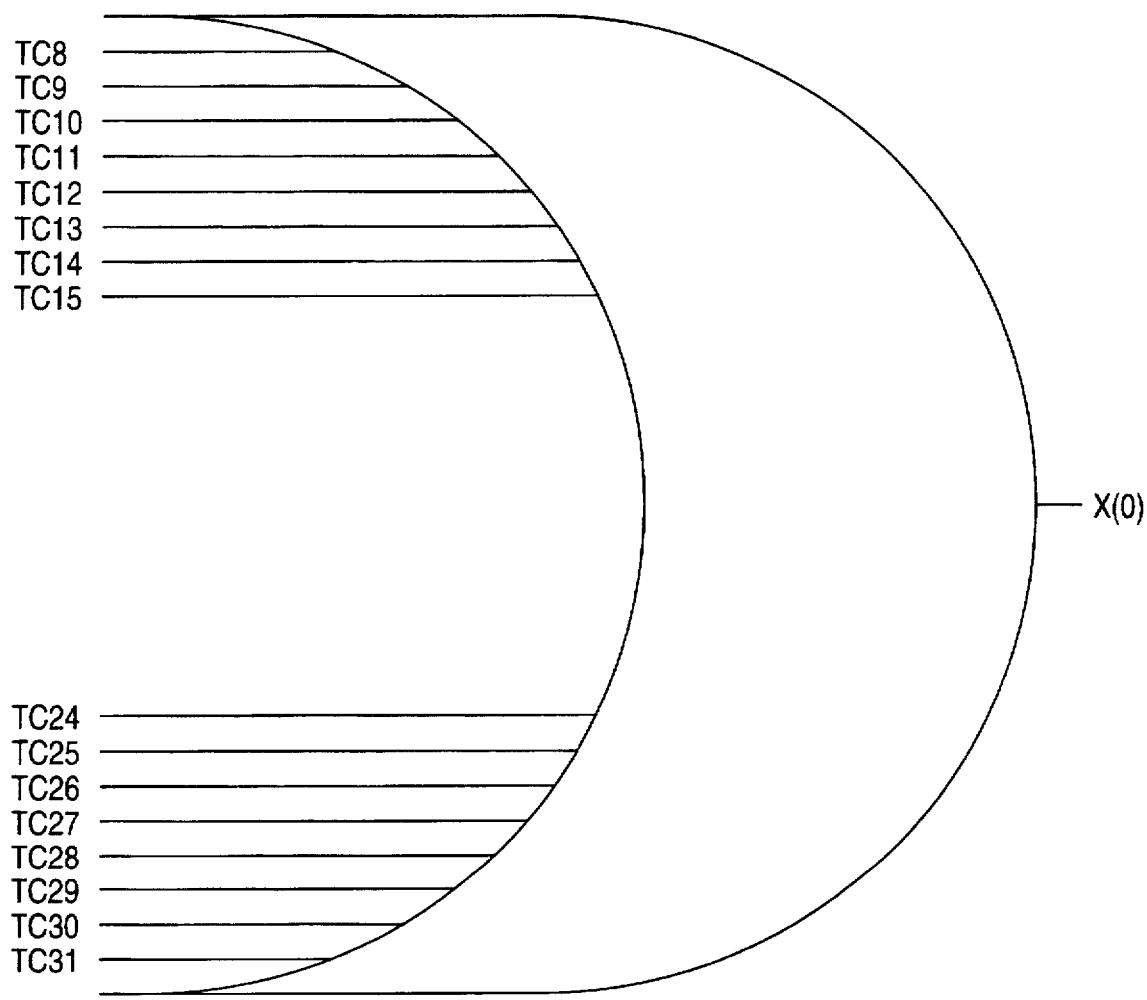
FIG. 10e shows an embodiment of the encoding of the thermometer code levels to provide the x(0) bit of x̂ using a wide OR gate.
Figure 10F:
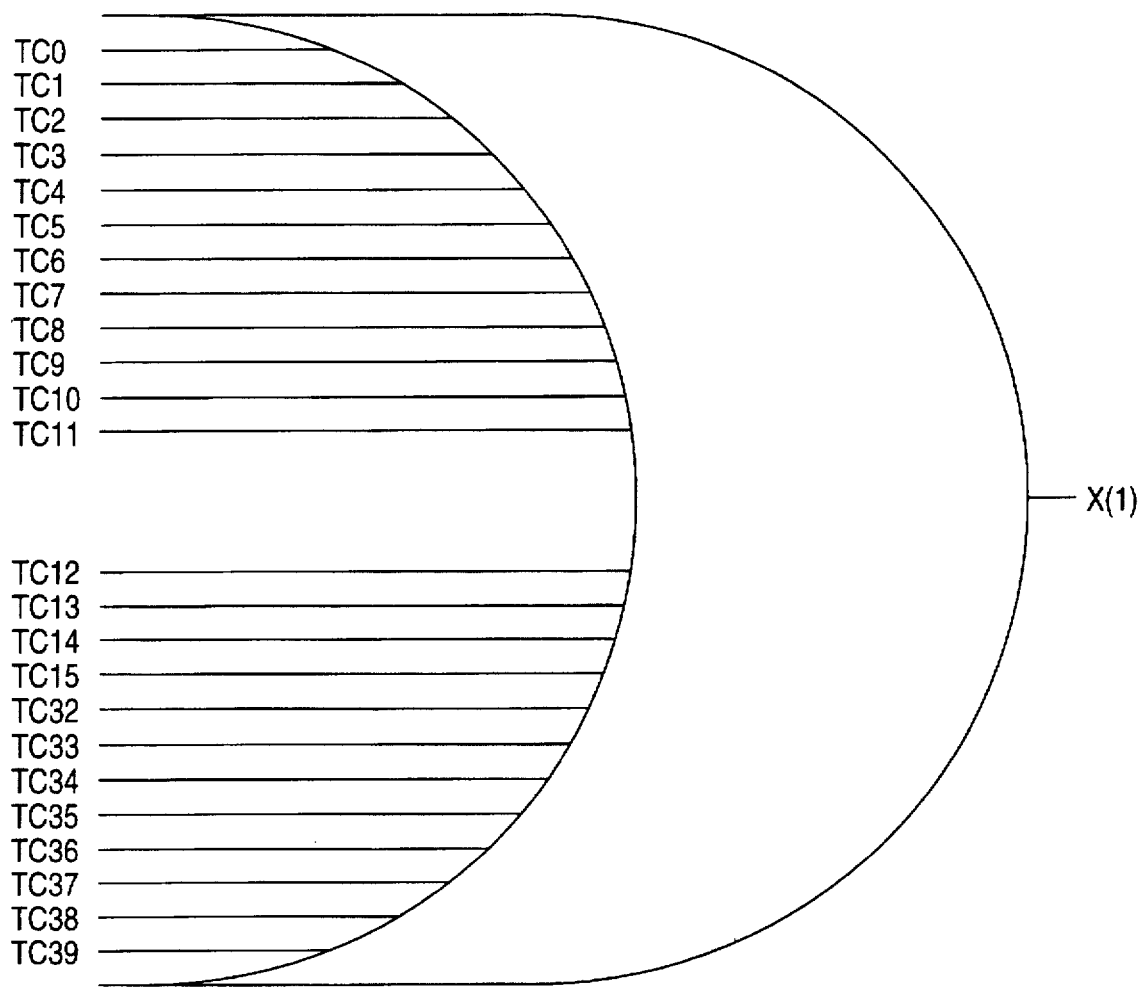
FIG. 10f shows an embodiment of the encoding of the thermometer code levels to provide the x(1) bit of x̂ using a wide OR gate.
Figure 10G:
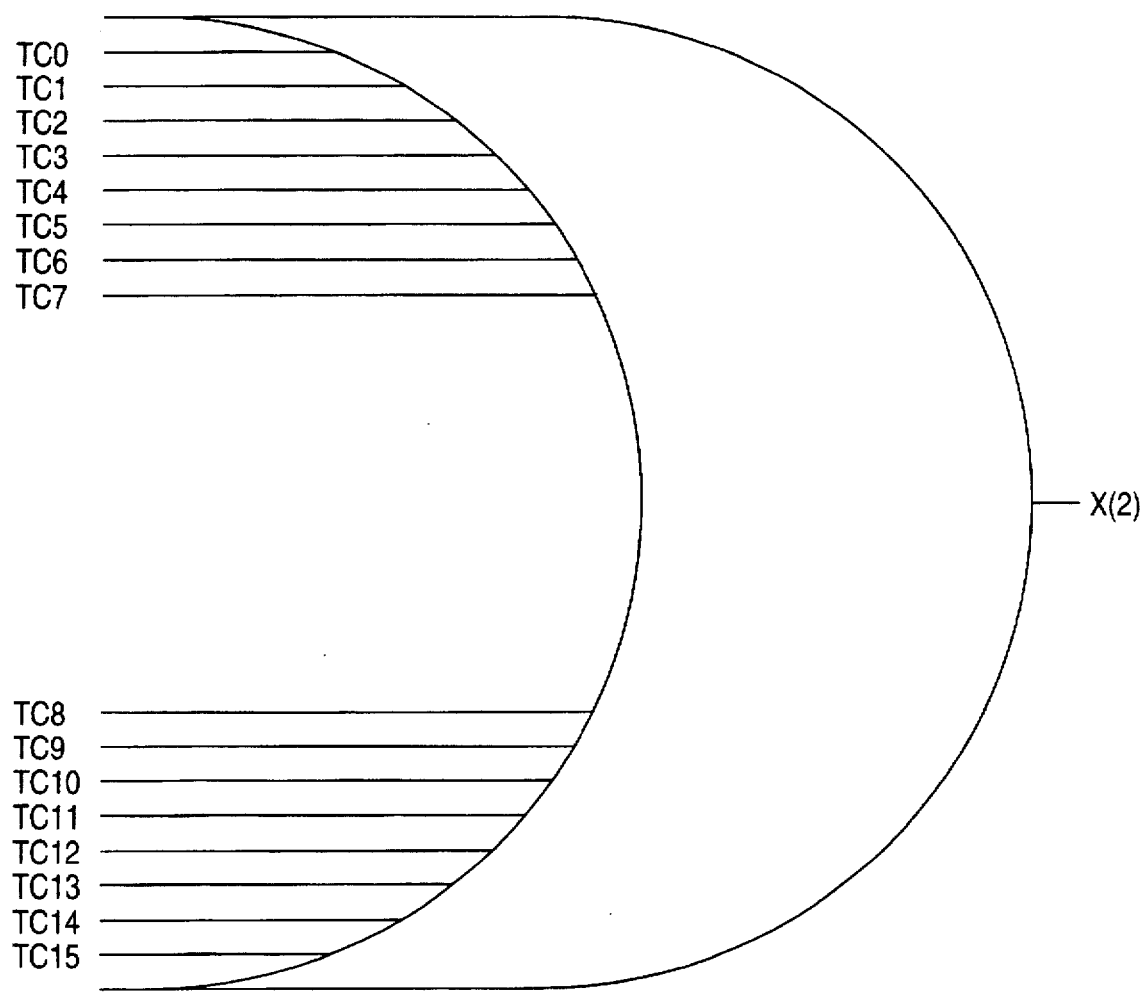
FIG. 10g shows an embodiment of the encoding of the thermometer code levels to provide the x(2) bit of x̂ using a wide OR gate.

The circuit architecture in accordance with one embodiment of this invention embeds the implementation of the phase error calculations in the ADC to simplify the overall circuit implementation. The ADC's used in PRML channels are usually six (6) bits in resolution and 2's complement in output format. The timing Eqs. (5) and (6) suggest a new encoding method for the ADC output. Instead of the 2's complement format, the ADC output can be encoded in $(\hat{x},\hat{e})$ format. A one-to-one mapping exists between the thermometer code levels and the $(\hat{x},\hat{e})$ representation. The mapping of the thermometer code levels to the $(\hat{x},\hat{e})$ representation is shown in FIG. 10a. In the representation, the higher order three (3) bits represent $\hat{x}$ and the lower order three (3) bits represent $\hat{e}$. Hence, using $(\hat{x},\hat{e})$ format provides both quantities necessary to give a measure of the phase error but still requires only a total of six (6) bits of resolution. One embodiment using a combination of six (6) wide OR gates (one OR gate for each bit of $\hat{e}$ and $\hat{x}$) to encode the thermometer code levels into each of the bits of $\hat{e}=e(2)e(1)e(0)$ and $\hat{x}=x(2)x(1)x(0)$ is shown in FIGS. 10b–10g. The number of OR gates used depends on whether the design choices made permit an OR gate having up to twenty-four (24) input terminals to be used. The number of input terminals required for each OR gate may be halved by using a three (3) OR gate combination for each OR gate shown in FIGS. 10b–10g.

The $(\hat{x},\hat{e})$ decoding method allows phase error calculations to be done using intermediate signals available in the ADC without going through the full decoding process. This simplifies the circuitry and the computational delay is minimized. Conventional methods typically require decoding the ADC values into $y_n$ and a further decoding step into $\hat{x}_n$ and $\hat{e}_n$.

Figure 11A:
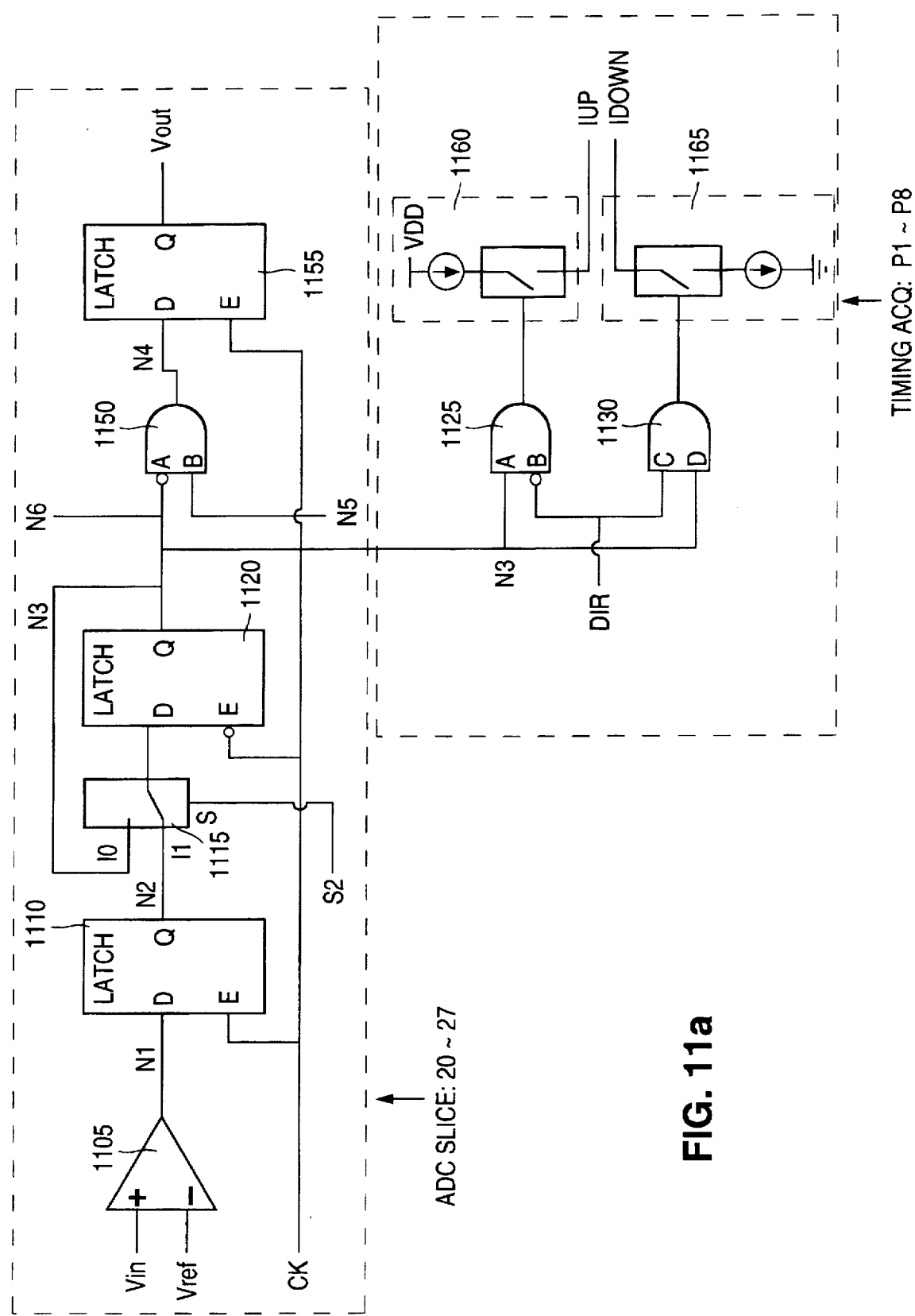
FIG. 11a shows ADC slices 20–27 and Timing ACQ's P1–P8 for timing acquisition in accordance with an embodiment of this invention.
Figure 11B:
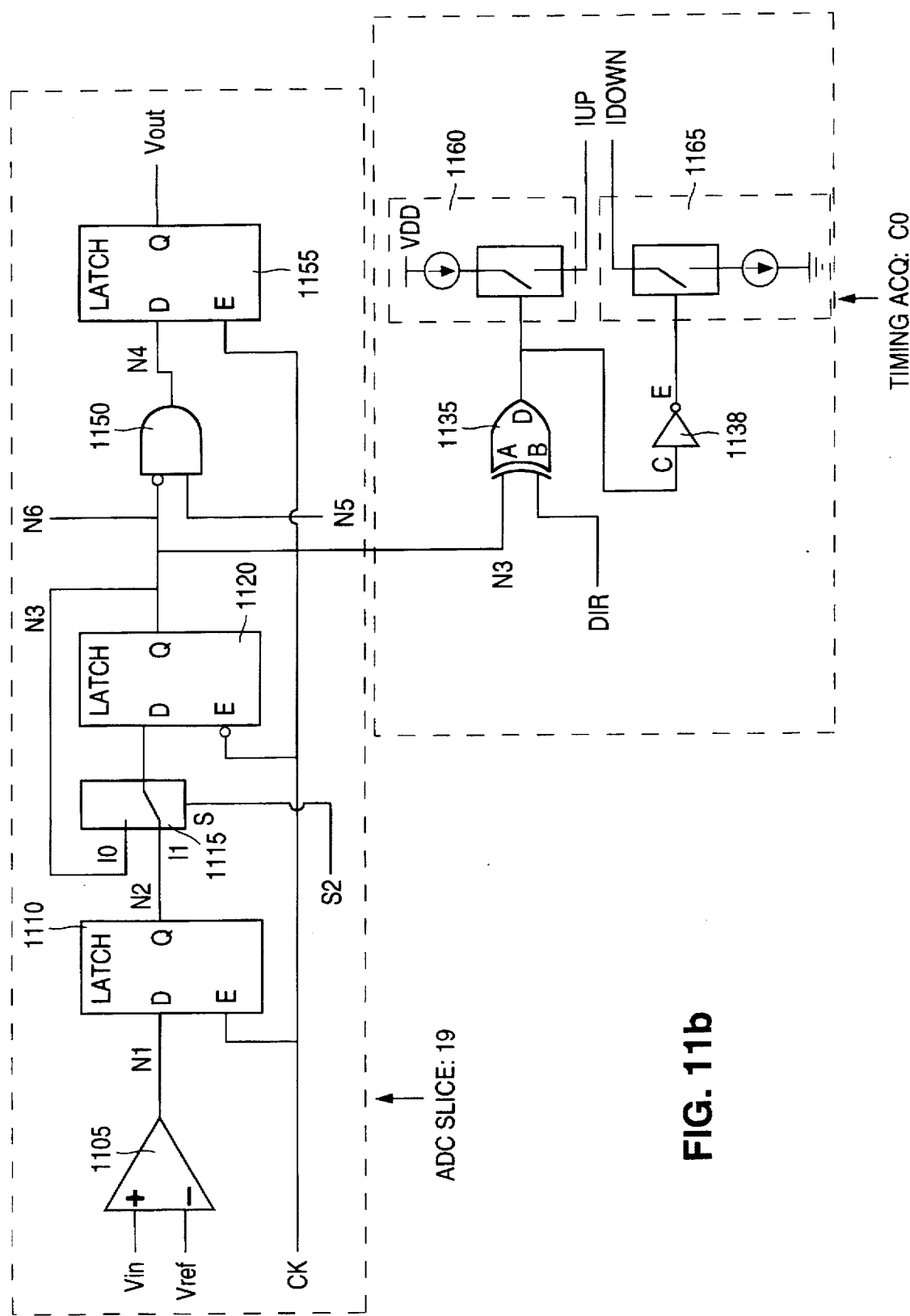
FIG. 11b shows ADC slice 19 and Timing ACQ C0 for timing acquisition in accordance with an embodiment of this invention.
Figure 11C:
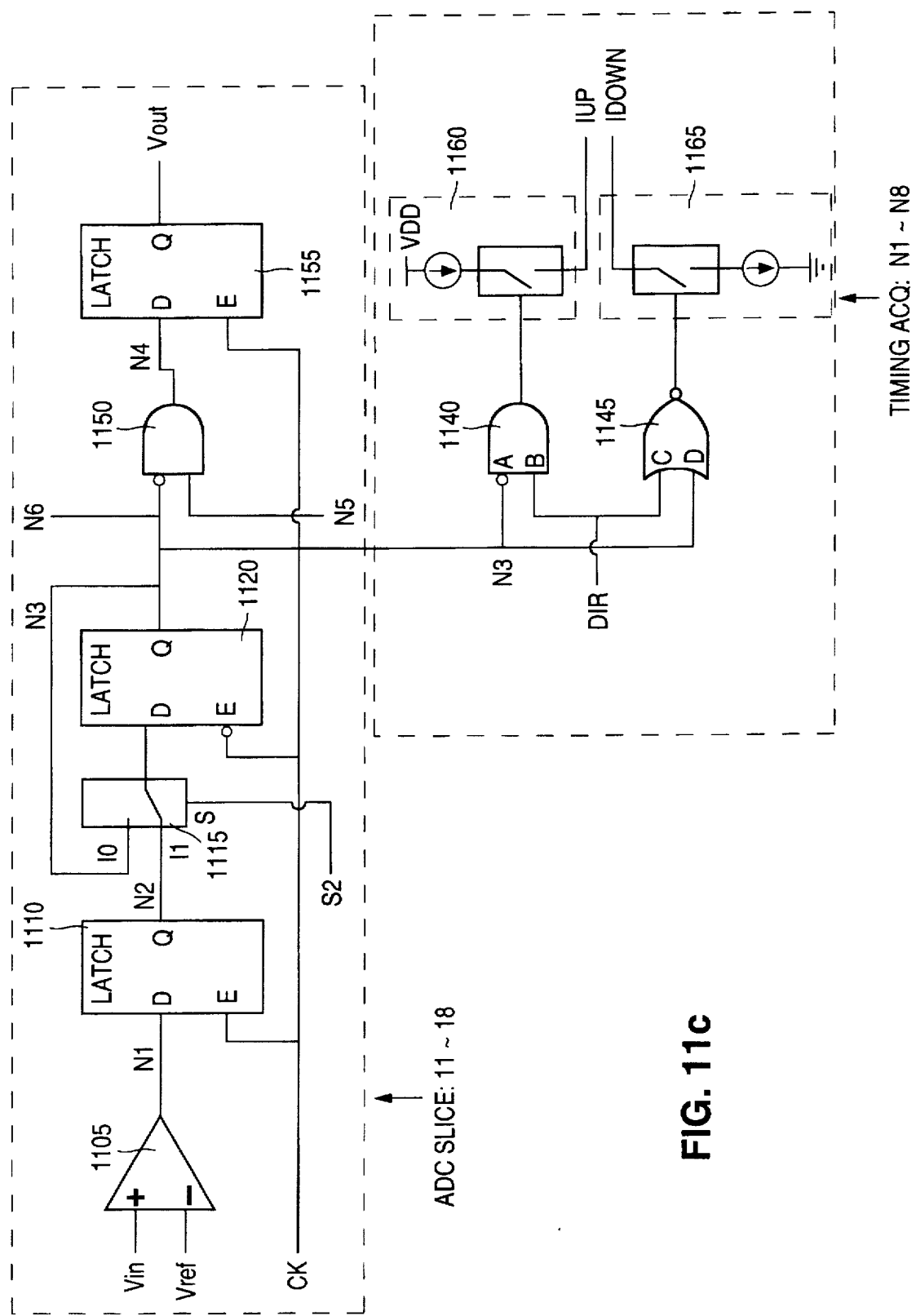
FIG. 11c shows ADC slices 11–18 and Timing ACQ's N1–N8 for timing acquisition in accordance with an embodiment of this invention.

FIGS. 11a–11c show one embodiment of a 1-bit slice of the ADC and also the three types of Timing ACQ slices which are used in accordance with this invention for the synchronous timing acquisition mode. FIG. 11a shows the ADC slices 20–27 with the accompanying Timing ACQ slices P1–P8; FIG. 11b shows the ADC slice 19 with the accompanying Timing ACQ slice C0; and FIG. 11c shows the ADC slices 11–18 with the accompanying Timing ACQ slices N1–N8. The ADC slice in FIGS. 11a–11c is identical. ADC slices 0–10 and ADC slices 28–39 are similar to the ADC slices shown in FIGS. 11a–11c except for the lack of connection to a Timing ACQ and ADC slice 0 lacks connection to a slice below while ADC slice 39 lacks connection to a slice above.

As shown in FIG. 11a, for each ADC slice, a $V_{in}$ and $V_{ref}$ voltage enter differential comparator 1105 which outputs a logic 1 or a logic 0 signal into latch 1110 depending on whether $V_{in}>V_{ref}$ or $V_{in}<V_{ref}$ respectively. Latch enable input terminal E of latch 1110 receives clock signal (CK) to control latch is timing. When clock signal (CK) at latch enable input terminal E of latch 1110 is high, data output terminal Q of latch 1110 is coupled to data input terminal D of latch 1110. When clock signal (CK) at latch enable input terminal E of latch 1110 is low, data output terminal Q of latch 1110 is decoupled from data input terminal D of latch 1110. Data output terminal Q maintains the value of data at data input terminal D just before the transition of clock signal (CK) from high to low at latch enable input terminal E.

Data signal on lead N2 from data output terminal Q of latch 1110 is coupled to data input terminal I1 of multiplexer 1115. Control signal S2 at input terminal S of multiplexer 1115 determines whether multiplexer 1115 accepts data signal on lead N2 coupled to data input terminal I1 or takes data signal on lead N3 from data output terminal Q of latch 1120 coupled to data input terminal I0 of multiplexer 1115. The effect of control signal on lead S2 at input terminal S of multiplexer 1115 being low is to cause multiplexer 1115 to switch to data signal on lead N3 from data output terminal Q of latch 1120. Therefore, a low control signal on lead S2 prevents the gain sample information from passing through multiplexer 1115 and the remainder of the circuit. Because latch enable input terminal E of latch 1120 works on active low clocks, data output terminal Q of latch 1120 is not coupled to data input terminal D of latch 1120 until the clock signal goes low corresponding to a falling edge of the clock signal (CK). When the clock signal is high, data output terminal Q of latch 1120 maintains the value of data at input terminal D just before the transition of the clock signal from low to high at latch enable input terminal E of latch 1120.

Referring again to FIG. 11a, data signal on lead N3 travels to the upper adjoining slice as data signal on lead N6 and is inverted upon entering data input terminal A of AND gate 1150. Data signal on lead N5 is the signal on lead "N3" entering from the ADC slice immediately below and enters data input terminal B of AND gate 1150. The effect of this logic is to convert the CMP output signals to produce the 40 unique levels, $TC_0$ to $TC_{39}$ (see FIG. 7). Data signal on lead N4 is passed to data input terminal D of latch 1155. When clock signal (CK) at latch enable input terminal E of latch 1155 is high, data output terminal Q of latch 1155 is coupled to data input terminal D of latch 1155. When the clock signal at latch enable input terminal E of latch 1155 is low, data output terminal Q of latch 1155 is decoupled from data input terminal D of latch 1155. Data output terminal Q maintains the value of data in terminal D just before the transition of the clock signal (CK) from high to low at latch enable input terminal E. Output terminal Q of latch 1155 connects to the input terminal of encoder 1310 shown in FIG. 13.

Data signal on lead N3 (FIG. 11a, for example), which is low or high depending on whether $V_{in}$ is less than or greater than $V_{ref}$ for the particular ADC slice, respectively, goes to the accompanying Timing ACQ slice. As noted above, there are three different types of Timing ACQ slices used in the acquisition mode and shown in FIGS. 11a–11c. FIG. 11a shows Timing ACQ slices P1–P8 where data signal on lead N3 is fed into data input terminal A of AND gate 1125 and data input terminal D of AND gate 1130, respectively. Control signal lead DIR is inverted entering input terminal B of AND gate 1125 while input terminal C of AND gate 1130 receives control signal on lead DIR directly. Control signal on lead DIR originates from VCO 635 and controls the polarity to be applied to the current sample. If data signal on lead N3 at input terminal C of AND gate 1130 and control signal on lead DIR at input terminal D of AND gate 1130 are both high, switched current source 1165 is activated and a fixed amount of $I_{down}$ current is provided by Timing ACQ's P1–P8. Similarly, a fixed amount of $I_{up}$ current is supplied by Timing ACQ's P1–P8 if data signal on lead N3 is high at input terminal A of AND gate 1125 and if control signal on lead DIR is low at inverted input terminal B of AND gate 1125 so as to activate switched current source 1160. Therefore, as long as data signal on lead N3 is high, either an $I_{down}$ or $I_{up}$ current will be supplied from the Timing ACQ's P1–P8 to loop filter 675 (FIG. 6) which generates a voltage to drive VCO 635. In one embodiment of this invention, the logic portion of the ACQ Timing slice physically resides in flash comparators 620 while the switches and analog portion reside in DAC 640. Switched current source 1160 and switched current source 1165 in one embodiment use bipolar transistors.

FIG. 11b shows ADC slice 19 with accompanying Timing ACQ C0. The ADC slice operates in the same manner as described above. Data signal on lead N3 is fed into input terminal A of XOR gate 1135 and control signal on lead DIR' is fed into input terminal B of XOR gate 1135 of Timing ACQ C0. If the output terminal D of XOR gate 1135 is high, switched current source 1160 is activated and a fixed amount of $I_{up}$ current is supplied. If the output terminal D of XOR gate 1135 is low, a fixed amount of current $I_{down}$ is supplied since a low signal to input terminal C of invertor 1138 results in a high signal at output terminal E of invertor 1138 causing switched current source 1165 to be activated. A fixed current, either $I_{up}$ or $I_{down}$ is always supplied from the Timing ACQ slice C0. In the event that the PLL is locked on, the $I_{up}$ and $I_{down}$ current coming from the Timing ACQ C0 slice alternately advance and retard the phase (i.e. there is always a current being generated by the C0 Timing ACQ).

FIG. 11c shows ADC slice: 11–18 with accompanying Timing ACQ's N1–N8. The ADC slices operate in the same manner as described above. Data signal on lead N3 is fed into inverted input terminal A of AND gate 1140 and into input terminal D of NOR gate 1145. Control signal on lead DIR is fed into input terminal B of AND gate 1140 and into input terminal C of NOR gate 1145. If both data signal on lead N3 and control signal on lead DIR are low, switched current source 1165 is activated and an $I_{down}$ current is generated. Because data signal on lead N3 feeding into AND gate 1140 at input terminal A is inverted, if data signal on lead N3 is low and control signal on lead DIR is high, switched current source 1160 is activated and an $I_{up}$ current is generated.

Figure 12:
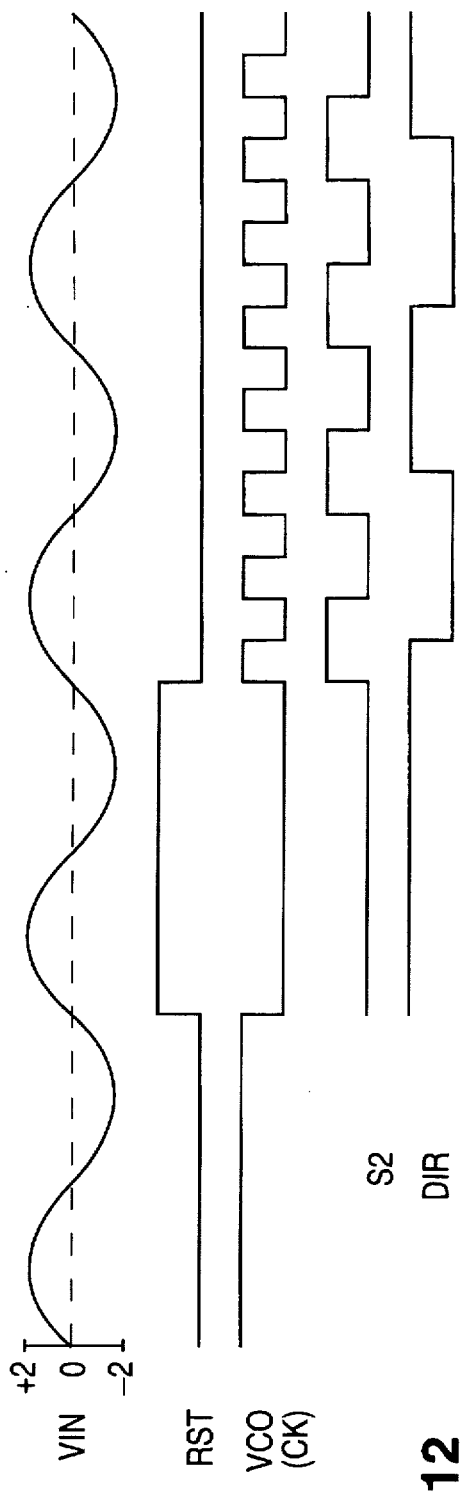
FIG. 12 shows the preamble and timing signals used during acquisition in accordance with an embodiment of this invention.

FIG. 12 shows the temporal relationship of the various timing signals. VIN is the sine wave preamble used during timing acquisition mode. RST is the VCO reset signal which causes a zero-phase restart of the clock to be initiated. Zero-phase restart of the PLL is initiated at an expected "0" crossing of the sine wave preamble by the falling edge of the RST signal. CK is the clock signal for the PLL. Control signal S2, which transitions low at the locations of the sine wave peaks, is used to cause the ADC circuits for the PLL to ignore every other sample. In particular, the PLL only uses samples at or near a "0" crossing. Control signal DIR provides slope sign information at the point the preamble is sampled. Control signal DIR is delayed in phase by an amount T/2 to account for the delay of the signal in the ADC slice due to latches 1110 and 1120. Therefore, the appropriate DIR signal is input into the Timing ACQ's when the input signal has had sufficient time to propagate through latch 1110 and latch 1120 into the Timing ACQ.

Figure 13:
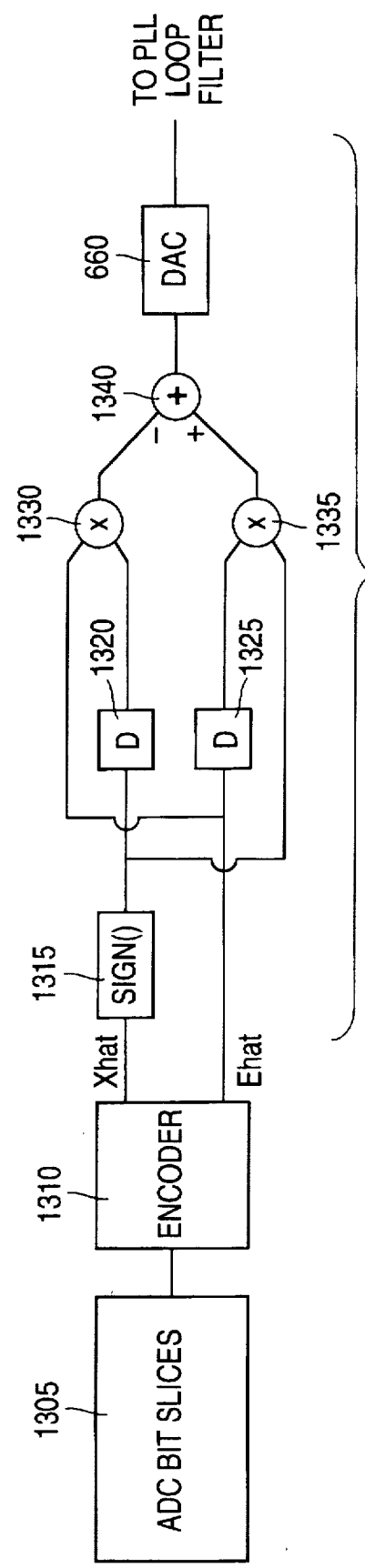
FIG. 13 shows a timing tracking mode phase detector block diagram in accordance with an embodiment of this invention.

For the synchronous data tracking timing circuit, $V_{out}$ in FIG. 11a–11c passes into encoder 1310 from the ADC bit slices 1305 as shown in FIG. 13. Encoder 1310 implements the one-to-one mapping shown in FIG. 10a to generate $\hat{x}$ and $\hat{e}$ from the thermometer code level representation. An embodiment for encoding $\hat{x}$ and $\hat{e}$ from the representation is shown in FIGS. 10b–10g. The specific implementation is dictated by design choices and depends in part on how many inputs an OR gate may have for a specific design choice. The sign function (see Eq. (7) ) is implemented in a standard manner in the sign function implementation block 1315. Reduction of $\hat{x}$ to sign($\hat{x}$) allows the implementation of simplified multiplier 1330 and multiplier 1335. Depending on the value of sign($\hat{x}$), the possible multiplier outputs are limited to 0, ê or –ê allowing the multipliers to have reduced complexity and higher speed than a full multiplier implementation. The sign($\hat{x}$) signal is provided to multiplier 1335 prior to delay 1320 and provides the present sample value, sign($\hat{x}_n$), to multiplier 1335. The signal ê is provided to multiplier 1335 through delay 1325. Delay 1325 delays signal ê for one clock cycle, thereby providing the previous ê sample value, $\hat{e}_{n-1}$, to multiplier 1335 at time step n. Multiplier 1335 performs the operation $\hat{e}_{n-1}$ *sign[$\hat{x}_n$]. Similarly, the ê signal is provided to multiplier 1330 without going through delay 1325, providing the present ê sample value, $\hat{e}_n$, to multiplier 1330. The signal sign($\hat{x}$) passes through delay 1320. Delay 1320 delays signal sign($\hat{x}$) for one clock cycle, thereby feeding previous signal sign($\hat{x}_{n-1}$) into multiplier 1330 at time step n. Multiplier 1330 performs the operation $\hat{e}_n$*sign[$\hat{x}_{n-1}$]. The signal from multiplier 1330 is inverted before being added in adder 1340 to the signal from multiplier 1335. The adder 1340 performs the calculation of Eq. (6) for the phase error. The digital phase error calculated in adder 1340 is converted to an analog signal in DAC 660 which in one embodiment may be a charge pump. An $I_{up}$ or $I_{down}$ current of appropriate magnitude is sent from DAC 660 to PLL loop filter 675 (see FIG. 6) to generate a control voltage for VCO 635. VCO 635 either retards or advances the timing phase in response to the applied control voltage.

Automatic Gain Control Loop

The gain error equation developed for EPRML is:

$$\gamma_n = \hat{e}_n * \text{sign}[\hat{x}_n] \tag{8}$$

and $$\hat{e}_n = y_n - \hat{x}$$

where $y_n$ is the sampled value, $\hat{x}_n$ is the ideal sample value that is closest to $y_n$, $\hat{e}_n$ is the decision error and the sign function is defined as in Eq. (7).

In one embodiment of the invention, the circuit architecture embeds the implementation of the gain error calculations in the ADC to simplify the overall circuit implementation. The ADC's used in PRML channels are usually 6 bits and 2's complement in output format. However, this is merely one embodiment and an ADC may be used consisting of n bits of output where n is an appropriate integer. The equation for gain error, Eq. (8), suggests a new encoding method for the ADC output. Instead of the typical 2's complement format, the ADC output can be encoded in the ($\hat{x}$,$\hat{e}$) format. A one-to-one mapping exists between the CMP output values and the ($\hat{x}$,$\hat{e}$) representation. The mapping of the CMP output values to the ($\hat{x}$,$\hat{e}$) is performed by standard combinational logic and the resulting representation is shown in FIG. 10. In this representation the higher 3 bits represent $\hat{x}$ and the lower order 3 bits represent $\hat{e}$. An advantage of this encoding method is that the gain error calculations can be done using the intermediate signals available in the ADC without going through the full encoding process. Consequently, the computational delay is minimized. Minimizing the computational delay during acquisition is important because the acquisition AGC loop operates in high bandwidth.

An intermediate stage between the analog continuous-time acquisition mode and the digital discrete-time tracking mode consists of a high bandwidth digital discrete-time loop operating in acquisition mode. The intermediate stage compensates for potential mismatches between the voltage reference of the analog acquisition loop and the voltage reference of the ADC during the digital tracking loop. Effectively, the acquisition mode is divided into two substages, analog continuous-time mode and digital discrete-time mode. The key difference between the acquisition digital mode and the tracking digital mode is that the acquisition mode has a higher closed loop bandwidth. The higher bandwidth of the digital discrete-time loop during acquisition allows mismatches between the voltage references of the analog acquisition loop and the voltage reference for the ADC to be compensated before data handling occurs. Without this intermediate mode, the selection of the tracking AGC bandwidth needs to be compromised between speed of convergence and noise sensitivity. To further assist a faster convergence of the digital acquisition loop, the voltage reference for the analog acquisition loop is made programmable so that its difference from the ADC voltage reference can be minimized by setting its value appropriately. The voltage reference will vary from chip to chip because it depends on the characteristics of the individual chip. Further the operating environment (i.e. temperature) of the chip will affect the voltage levels so the programmable voltage reference is not sufficient to overcome the potential mismatch in the AGC circuit.

Figure 14:
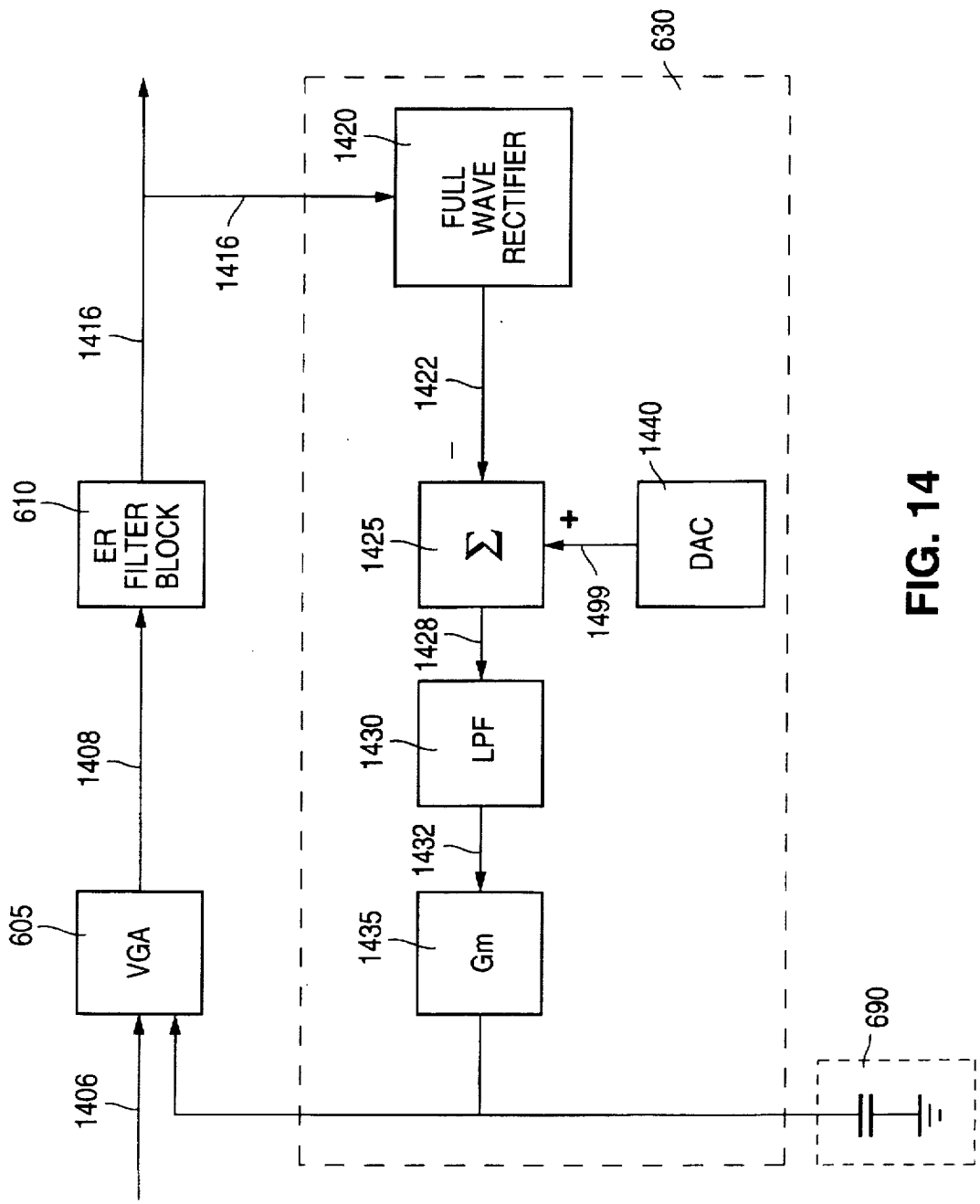
FIG. 14 shows an analog acquisition mode gain detector block diagram in accordance with an embodiment of this invention.

FIG. 14 shows one embodiment of the analog acquisition AGC loop. During acquisition mode, the signal being processed is the sine wave preamble in one embodiment. Sine wave preamble signal on lead 1406 enters variable gain amplifier (VGA) 605 where the gain of signal on lead 1406 is adjusted. Gain adjusted signal on lead 1408 is filtered and equalized in ER filter block 610 (see also FIG. 6). Equalized signal on lead 1416 (FIG. 14) feeds into full wave rectifier 1420. A rectified signal is needed for adder 1425. Rectified signal on lead 1422 is inverted and summed with AGC reference signal on lead 1499 in adder 1425. Reference AGC signal on lead 1499 is generated in 7-bit digital-to-analog converter (DAC) 1440 which contains a programmable register for setting the desired level of the AGC reference signal on lead 1499. Output signal on lead 1428 is the difference between rectified acquisition signal on lead 1422 and AGC reference signal on lead 1499. Hence, difference signal on lead 1428 represents gain error. Difference signal on lead 1428 is sent into low pass filter (LPF) 1430 to remove the high frequency noise residing on difference signal on lead 1428. Voltage to current converter (Gm) 1435 converts filtered difference signal on lead 1432 from a voltage into a current with gain Gm. The filter serves to integrate the difference signal to smooth out rapid fluctuations. Gain loop filter 690 (see also FIG. 6) provides a control voltage to VGA 605 to increase or decrease the gain by an appropriate amount.

Figure 15:
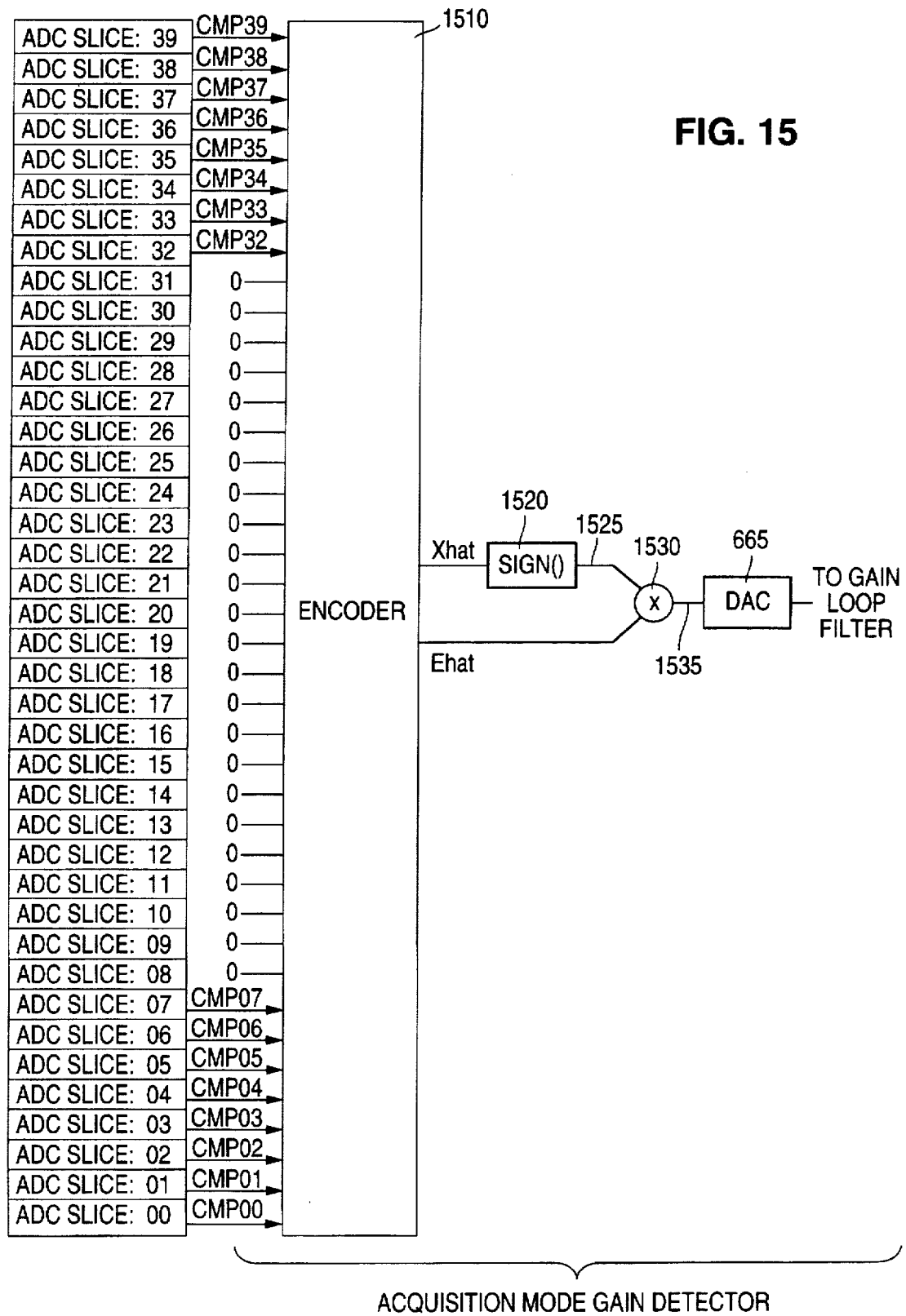
FIG. 15 shows a digital acquisition mode gain detector block diagram in accordance with an embodiment of this invention.

The analog gain acquisition mode functions to provide approximately the correct gain during gain acquisition mode. The digital gain acquisition mode serves to fine tune the gain applied to the acquisition signal. One embodiment of the digital acquisition mode gain detector of is shown in FIG. 15. Only comparators CMP32–CMP39 and CMP00–CMP07 are used for the digital gain acquisition mode. Gain information is processed every 2T during acquisition mode where T is the sample time. CMP32–CMP39 are the comparators corresponding to thresholds 1+⅛ to 2+⅛, respectively while CMP00–CMP07 are the comparators corresponding to thresholds −2−⅛ to −1−⅛, respectively. Thus, only the comparators corresponding to the positive and negative peak regions of the preamble are sampled during digital gain acquisition mode. Comparators CMP08–CMP31 are not used during the digital gain acquisition mode. The use of only 16 comparators during digital gain acquisition mode allows for less complex circuitry and a faster calculation of the gain error.

In EPRML, the value $\hat{x}$ is restricted to either +2 or −2 for the sine wave preamble amplitude. Encoder 1510 converts the comparator outputs into $\hat{x}$ and $\hat{e}$ representation to allow calculation of the gain error according to Eq. (8). The conversion of the thermometer code levels in encoder 1510 to ($\hat{x}$,$\hat{e}$) format in one embodiment uses a combination of OR gates as shown in FIGS. 10b–10g. $\hat{x}$ and $\hat{e}$ are output from encoder 1510 with signal $\hat{e}$ going directly to multiplier 1530. The sign function (see Eq. (7)) is implemented in a simplified manner in sign function implementation block 1520 since output signal on lead 1525 of sign function implementation block 1520 will be either high or low. Signal on lead 1525 representing sign($\hat{x}_n$) enters simplified multiplier 1530. A full multiplier is not needed since multiplier 1530 performs the operation $\hat{e}_n$*sign($\hat{x}_n$) with the output being either ê or inverted ê. Signal on lead 1535, representing a measure of the gain error $\gamma_n$, enters DAC 665 which in one embodiment may be a charge pump. An appropriate current is sent from DAC 665 to gain loop filter 690. Gain loop filter 690 produces a control voltage for VGA 605 which operates to either increase or decrease the gain applied to preamble input signal on lead 1406 during digital gain acquisition mode.

In digital gain tracking mode all the comparators, CMP00–CMP39, are used to sample the input data signal. Gain information is processed at each time increment, T. One embodiment of the tracking mode gain detector is shown in FIG. 16. The input data signal is digitized in ADC 1305 and encoded into ($\hat{x}$,ê) representation by encoder 1610. During tracking mode, $\hat{x}$ is the ideal sample value (+2, +1, 0, −1, −2 in EPRML) closest to signal sample value y. Signal ê enters multiplier 1630 directly from encoder 1610. The sign function (see Eq. (7)) is implemented in a standard manner in sign function implementation block 1620. Signal $\hat{x}$ enters sign function implementation block 1620 with resulting output signal on lead 1625 from sign function implementation block 1620 being either high, low or zero signal. Signal on lead 1625 enters multiplier 1630 with the reduction of $\hat{x}$ to sign($\hat{x}$) allowing implementation of simplified multiplier 1630. Simplified multiplier 1630 performs the operation $\hat{e}_n$*sign($\hat{x}_n$) which results in ê, inverted ê or zero signal. Output signal on lead 1635 from simplified multiplier 1630, representing a measure of the gain error, enters DAC 670. The digital gain error calculated by multiplier 1630 is converted to an analog signal in DAC 670 which in one embodiment may be a charge pump. An appropriate current is sent from DAC 670 to gain loop filter 690 (see FIG. 6). Gain loop filter 690 produces a control voltage for VGA 605 which operates to either increase or decrease the gain applied to data input signal on lead 601 during digital gain tracking mode.

The various embodiments of the methods and structure of this invention that are described above are illustrative only of the principles of this invention and are not intended to limit the scope of the invention to the particular embodiments described. In view of this disclosure, those skilled in the art can apply the methods and structure disclosed to other timing recovery systems. For example, the methods and structure described for using the output signals of the ADC comparators to drive the phase error charge pumps during acquisition may be applied to other timing recovery systems where the timing information is contained in "0" crossings or "0" samples. As an example, if a quarter-frequency sine wave is used as a preamble for other partial response systems, then all odd-order EPR4 family systems (EPR4, $E^3$PR4, $E^5$PR4, etc.) can use the same acquisition methods and structure as disclosed in accordance with this invention.

We claim:

1. A circuit for digital gain acquisition comprising:
   an analog-to-digital converter, said analog-to-digital converter comprising:
      a first plurality of bit slices;
   an encoder coupled to a subset of said first plurality of bit slices, said subset comprising a second plurality of bit slices;
   a digital-to-analog converter, said digital-to-analog converter being coupled to said encoder; and
   a gain control circuit coupled to said digital-to-analog converter;

wherein when said encoder receives a sampled reference input signal from said second plurality of bit slices, said sampled reference input signal is encoded into an ideal sample value closest to said sampled reference input signal and a decision error, said ideal sample value and said decision error being used to generate a first control signal passed to said digital-to-analog converter, said digital-to-analog converter generating a second control signal passed to said gain control circuit.

2. The circuit of claim 1 wherein said second control signal is a current.

3. The circuit of claim 1 wherein said ideal sample value is represented by three bits and said decision error is represented by three bits.

4. The circuit of claim 1 wherein said gain control circuit comprises a variable gain amplifier and a loop filter.

5. A circuit for digital gain tracking comprising:
   an analog-to-digital converter, said analog-to-digital converter comprising:
      a plurality of bit slices;
      an encoder coupled to said plurality of bit slices;
   a digital-to-analog converter, said digital-to-analog converter being coupled to said encoder; and
   a gain control circuit coupled to said digital-to-analog converter;

wherein when a data input signal is sampled by said bit slices to generate a sampled data input signal, said sampled data input signal is encoded into an ideal sample value closest to said sampled data input signal and a decision error, said ideal sample value and said decision error being used to generate a first control signal passed to said digital-to-analog converter, said digital-to-analog converter generating a second control signal passed to said gain control circuit.

6. The circuit of claim 5 wherein said analog-to-digital converter has n bits of output where n is an integer.

7. The circuit of claim 6 wherein n is equal to six.

8. The circuit of claim 5 wherein said gain control circuit acts to maintain correct amplification of said data input signal.

9. A combined analog and digital automatic gain control circuit for sampled-data receivers comprising:
   an analog continuous-time acquisition circuit;
   a digital discrete-time acquisition circuit; and
   a digital discrete-time tracking circuit;
wherein said analog continuous-time acquisition circuit uses a first input signal to adjust acquisition gain and said digital discrete-time acquisition circuit uses said first input signal encoded into a first ideal sample value closest to said first input signal and a first decision error to further adjust acquisition gain and said digital discrete-time tracking circuit uses a second input signal encoded into a second ideal sample value and a second decision error to adjust tracking gain.

10. A method for encoding an equalized partial response input signal which allows gain error calculations using intermediate signals available in an analog-to-digital converter, which comprises:
   receiving said equalized partial response input signal in said analog-to-digital converter,
   sampling said equalized partial response input signal in said analog-to-digital converter to produce a sampled equalized partial response input signal, and
   encoding said sampled equalized partial response input signal into an ideal value closest to said sampled equalized partial response input signal and a decision error to allow calculation of gain error.

11. The method of claim 10 wherein said ideal value closest to said sampled equalized partial response input signal is replaced by a value determined by application of the sign function to said ideal value closest to said sampled equalized partial response input signal to allow calculation of gain error.

12. The method of claim 11 wherein said value determined by application of the sign function is restricted to one, zero or minus one.

13. The method of claim 12 wherein said sign function comprises:

$\text{sign}[\hat{x}] = +1$ if $\hat{x} = +2, +1$ $\text{sign}[\hat{x}] = 0$ if $\hat{x} = 0$ $\text{sign}[\hat{x}] = -1$ if $\hat{x} = -2, -1$.

14. The method of claim 10 wherein said equalized partial response input signal is an EPR4 input signal.

15. The method of claim 10 wherein said equalized partial response input signal is a PR4 input signal.

16. The method of claim 10 wherein said equalized partial response input signal is a reference input signal of the odd-order Extended Class IV family.

17. The circuit of claim 5 wherein said analog-to-digital converter has n levels.

18. The circuit of claim 17 wherein n is equal to forty.

* * * * *